United States Patent
Fujimori et al.

(10) Patent No.: US 6,207,343 B1
(45) Date of Patent: Mar. 27, 2001

(54) POSITIVE PHOTOSENSITIVE COMPOSITION

(75) Inventors: Toru Fujimori; Shiro Tan, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/292,052

(22) Filed: Apr. 14, 1999

(30) Foreign Application Priority Data

Apr. 14, 1998 (JP) .................................................. 10-102822
Apr. 24, 1998 (JP) .................................................. 10-115253

(51) Int. Cl.$^7$ ..................................................... G03F 7/004
(52) U.S. Cl. ........................ 430/270.1; 430/905; 430/910
(58) Field of Search ................................ 430/270.1, 905, 430/910

(56) References Cited

U.S. PATENT DOCUMENTS

| | | | |
|---|---|---|---|
| 5,891,603 | * 4/1999 | Kodama et al. | 430/270.1 |
| 5,939,234 | * 8/1999 | Tamanaka et al. | 430/270.1 |
| 5,962,180 | * 10/1999 | Iwanaga et al. | 430/170 |
| 5,994,025 | * 11/1999 | Iwasa et al. | 430/270.1 |
| 5,998,099 | * 12/1999 | Houlihan et al. | 430/311 |
| 6,004,721 | * 12/1999 | Tan et al. | 430/270.1 |

* cited by examiner

Primary Examiner—John S. Chu
(74) Attorney, Agent, or Firm—Sughrue, Mion, Zinn, Macpeak & Seas, PLLC

(57) ABSTRACT

The present invention provides a positive photosensitive composition comprising a compound having a group represented by the following general formula (Ia) or (Ib) which decomposes by the action of an acid to enhance its solubility in an alkaline developing solution and a compound which generates an acid upon irradiation with actinic rays or radiation:

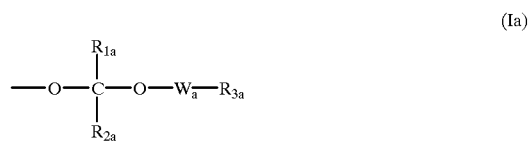

(Ia)

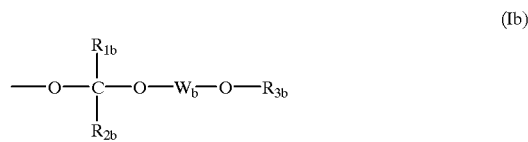

(Ib)

wherein $R_{1a}$ and $R_{2a}$ each represent a hydrogen atom or a $C_{1-4}$ alkyl group; $W_a$ represents a single bond or a divalent organic group; $R_{3a}$ represents a group which decomposes the action of an acid; $R_{1b}$ and $R_{2b}$ each represent a hydrogen atom or a $C_{1-4}$ alkyl group; $W_b$ represents a divalent organic group; and $R_{3b}$ represents a $C_{11-20}$ chain alkyl group which may have substituents, a $C_{11-20}$ cyclic alkyl group which may have substituents, a $C_{11-30}$ aryl group which may have substituents or a $C_{12-30}$ aralkyl group which may have substituents.

7 Claims, No Drawings

POSITIVE PHOTOSENSITIVE COMPOSITION

FIELD OF THE INVENTION

The present invention relates to a positive photosensitive composition for use in the production of semiconductor integrated circuit element, mask for the production of integrated circuit, printed-wiring board, liquid crystal panel, etc.

BACKGROUND OF THE INVENTION

As a positive photosensitive composition there is disclosed chemically-sensitized positive resist compositions in U.S. Pat. No. 4,491,628 and EP 29,139. The chemically-sensitized positive resist composition is a pattern-forming material which, upon irradiation with radiation such as far infrared rays, produces at the exposed area an acid which is then used as a catalyst in the presence of which a reaction is effected to cause change in the solubility of the irradiated area and unirradiated area in a developing solution, thereby forming a pattern on the board.

The foregoing chemically-sensitized positive resist compositions can be roughly divided into three groups, i.e., ternary positive resist composition comprising an alkali-soluble resin composition, a compound which generates an acid upon irradiation with radiation (photo-acid generator) and a compound having an acid-decomposable group for inhibiting dissolution of the alkali-soluble resin, binary positive resist composition comprising a resin having a group which becomes alkali-soluble upon decomposition by the reaction with an acid and a photo-acid generator and hybrid positive resist composition a resin having a group which becomes alkali-soluble upon decomposition by the reaction with an acid, a low molecular dissolution inhibitive compound having an acid-decomposable group and a photo-acid generator.

JP-A-2-19847 (The term "JP-A" as used herein means an "unexamined published Japanese patent application") discloses a resist composition comprising a resin having the phenolic hydroxyl group in a poly(p-hyroxystyrene) entirely or partially protected by a tetrahydropyranyl group.

Similarly, JP-A-4-219757 discloses a resist composition comprising a resin having the phenolic hydroxyl group in a poly(p-hydroxystyrene) substituted by an acetal group in a proportion of from 20% to 70%.

Further, JP-A-5-249682 discloses a photoresist composition comprising a resin similarly protected by an acetal group. Moreover, JP-A-8-123032 discloses a photoresist composition comprising a ternary polymer containing a group substituted by an acetal group.

Further, JP-A-8-253534 discloses a photoresist composition comprising a partly-crosslinked polymer containing a group substituted by an acetal group.

Further, JP-A-8-15864 discloses a positive resist composition comprising as a resin composition a mixture of a polyhydroxystyrene having its hydroxyl group substituted by t-butoxycarbonyloxy group in a proportion of from 10 to 60 mol % and a polyhydroxystyrene having its hydroxyl group substituted by ethoxyethoxy group in a proportion of from 10 to 60 mol %.

Further, JP-A-9-319092 discloses that a resin comprising an acetal group having an oxy bond incorporated therein exerts an effect of lessening standing wave.

However, these prior art photoresist compositions comprising a resin containing an acid-decomposable group leave something to be desired in rectangularity of pattern profile. In particular, these prior art photoresist compositions are disadvantageous in that the corners of the top of profile are rounded.

Further, these prior art photoresist compositions comprising a resin containing an acid-decomposable group are disadvantageous in that they generate marked standing wave and give a pattern profile stained on the side wall thereof. It has thus been desired to overcome these difficulties.

SUMMARY OF THE INVENTION

It is therefore an object of the present invention to provide a chemically-sensitized positive photosensitive composition excellent in the shape of pattern profile, particularly the regularity of pattern profile, and the reproducibility of lone pattern and having a high resolution.

It is another object of the present invention to provide an excellent chemically-sensitized positive photosensitive composition excellent in the shape of pattern profile, particularly the smoothness in the shape of side wall of pattern, which exhibits a high dry etching resistance, a high sensitivity and a high resolution and generates no standing wave.

These and other objects of the present invention will become more apparent from the following detailed description and examples.

The inventors made extensive studies of the foregoing difficulties. As a result, it was found that the use of a first positive photosensitive composition comprising a compound containing an acid-decomposable group having a specific structure makes it possible to accomplish the foregoing former object of the present invention. The present invention has thus been worked out.

The first positive photosensitive composition according to the present invention has the following constitutions:

(1) A positive photosensitive composition, comprising:
  (a) a compound having a group represented by the following general formula (Ia) which decomposes by the action of an acid to enhance its solubility in an alkaline developing solution; and
  (b) a compound which generates an acid upon irradiation with actinic rays or radiation:

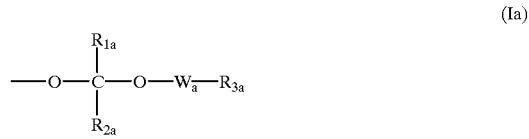

(Ia)

wherein $R_{1a}$ and $R_{2a}$ may be the same or different and each represent a hydrogen atom or a $C_{1-4}$ alkyl group; $W_a$ represents a single bond or a divalent organic group; and $R_{3a}$ represents a group which decomposes the action of an acid.

(2) The positive photosensitive composition according to Clause (1), wherein said component (a) is a resin having a group represented by the general formula (Ia) which decomposes by the action of an acid to enhance its solubility in an alkaline developing solution.

(3) The positive photosensitive composition according to Clause (1) or (2), further comprising a resin which is insoluble in water but soluble in an alkaline aqueous solution.

Further, the use of the following second positive photosensitive composition makes it possible to accomplish the foregoing latter object of the present invention. Thus, the present invention has been worked out.

The second positive photosensitive composition according to the present invention has the following constitutions:

(4) A positive photosensitive composition, comprising:
  (a) a resin having a group represented by the following general formula (Ib) which decomposes by the action of an acid to enhance its solubility in an alkaline developing solution; and
  (b) a compound which generates an acid upon irradiation with actinic rays or radiation:

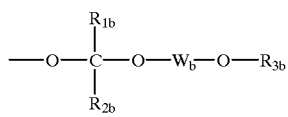

(Ib)

wherein $R_{1b}$ and $R_{2b}$ may be the same or different and each represent a hydrogen atom or a $C_{1-4}$ alkyl group; $W_b$ represents a divalent organic group; and $R_{3b}$ represents a $C_{11-20}$ chain alkyl group which may have substituents, a $C_{11-20}$ cyclic alkyl group which may have substituents, a $C_{11-30}$ aryl group which may have substituents or a $C_{12-30}$ aralkyl group which may have substituents.

(5) The positive photosensitive composition according to Clause (4), wherein $R_b$ and $R_{2b}$ may be the same or different and each represent a hydrogen atom or a $C_{1-4}$ alkyl group; $W_b$ represents a divalent organic group; and $R_{3b}$ represents a $C_{11-30}$ aryl group which may have substituents or a $C_{12-30}$ aralkyl group which may have substituents.

(6) The positive photosensitive composition according to Clause (4) or (5), further comprising a compound which decomposes by the action of an acid to enhance its solubility in an alkaline developing solution.

DETAILED DESCRIPTION OF THE INVENTION

The present invention will be further described hereinafter.

The compound (a) having a group represented by the foregoing general formula (Ia) which decomposes by the action of an acid to enhance its solubility in an alkaline developing solution will be further described below.

Examples of the alkyl group represented by $R_{1a}$ in the general formula (Ia) include $C_{1-4}$ alkyl groups such as methyl group, ethyl group, n-propyl group, isopropyl group, n-butyl group, isobutyl group, sec-butyl group and t-butyl group.

Preferred examples of the divalent organic group represented by $W_a$ include straight-chain, branched or cyclic alkylene, arylene, heteroarylene and aralkylene, which may have substituents, —S—, —C(=O)—, —N($R_{4a}$)—, —SO—, —SO$_2$—, —CO$_2$—, —N($R_{4a}$)SO$_2$—, and divalent group obtained by combining two or more of these groups. $R_{4a}$ represents a hydrogen atom or alkyl group (Specific examples of the alkyl group represented by $R_{4a}$ include those described with reference to $R_{1a}$).

An even more desirable divalent organic group represented by $W_a$ is a divalent group represented by the following general formula (W$_1$):

—(A)$_n$—(B)$_m$—(A)$_p$—    (W$_1$)

where A represents a straight-chain, branched or cyclic alkylene, arylene, heteroarylene or aralkylene group which may contain substituents; B represents —O—, —S—, —C(=O)—, —N($R_4$) —SO —S—, —SO$_2$—, —CO$_2$— or —N($R_{4a}$)SO$_2$—(in which $R_{4a}$ is as defined above); n represents an integer of from 0 to 5; m represents an integer of from 0 to 5; and p represents an integer of from 0 to 5, with the proviso that when a plurality of groups A are present, they may be the same or different.

Examples of the foregoing straight-chain, branched or cyclic alkylene group include $C_{1-10}$ alkylene group such as methylene group, ethylene group, propylene group, 1,4-butylene group and 1,4-cyclohexylene group.

Examples of the foregoing arylene group include phenylene group, naphthylene group, and anthrylene group.

Examples of the foregoing aralkylene group include toluylene group, xylylene group, and phenethylene group.

Examples of the foregoing heteroarylene group include divalent groups among those having the following structural formulae (A1) to (A4):

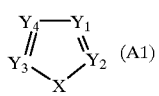

(A1)

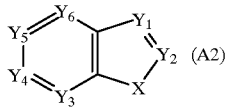

(A2)

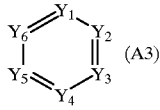

(A3)

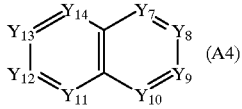

(A4)

wherein X represents an oxygen atom, sulfur atom or —NH—; $Y_1$ to $Y_6$ each represent —CH= or —N=, with the proviso that at least one of $Y_1$ to $Y_6$ in the structural formula (A3) represents —N=: and $Y_7$ to $Y_{14}$ each represent —CH= or —N=, with the proviso that at least one of $Y_7$ to $Y_{14}$ represents —N=.

As the foregoing group $R_{3a}$ which decomposes by the action of an acid (hereinafter also referred to as "acid-decomposable group") there may be used any such a group. A preferred example of the acid-decomposable group is —COOA$^0$, —O—A$^0$ or —O—C(=O)—O—A$^0$.

A$^0$ represents —C(R$^{01}$)(R$^{02}$)(R$^{03}$), —Si(R$^{01}$)(R$^{02}$)(R$^{03}$) or —C(R$^{04}$)(R$^{05}$) —O—R$^{06}$.

R$^{01}$, R$^{02}$, R$^{03}$, R$^{04}$ and R$^{05}$ may be the same or different and each represent a hydrogen atom, alkyl group, cycloalkyl group, alkenyl group or aryl group. R$^{06}$ represents an alkyl group or aryl group. At least two of R$^{01}$ to R03 are groups other than hydrogen atom. Two of R$^{01}$ to R$^{03}$ and two of R$^{04}$ to R$^{06}$ each combination may be connected to each other to form a cycle.

Preferred examples of the alkyl group represented by R$^{01}$, R$^{02}$, R$^{03}$, R$^{04}$ or R$_{05}$ include $C_{1-4}$ alkyl group such as methyl group, ethyl group, propyl group, n-butyl group, sec-butyl group and t-butyl group. Preferred examples of the cycloalkyl group represented by R$^{01}$, R$^2$, R$^{03}$, R$^{04}$ or R$^{05}$ include $C_{3-10}$ alkyl group such as cyclopropyl group, cyclobutyl group, cyclohexyl group and adamanthyl group. Preferred examples of the alkenyl group represented by $R^{01}$, $R^{02}$, $R^{03}$, $R^{04}$ or $R^{05}$ include $C_{2-4}$ alkenyl group such as vinyl group, propenyl group, allyl group and butenyl group. Preferred examples of the aryl group represented by $R^{01}$, $R^{02}$, $R^{03}$, $R^{04}$ or $R^{05}$ include $C_{6-14}$ alkyl group such as phenyl group, xylyl group, toluyl group, cumenyl group, naphthyl group and anthracenyl group.

Examples of the cycle which may be formed by the connection of two of $R^{01}$ to $R^{03}$ or two of $R^{04}$ to $R^{06}$ include $C_{5-10}$ cyclic alkyl group such as cyclohexyl group, cyclopentyl group and cyclobutyl group.

Examples of the substituents on these groups include hydroxyl group, halogen atom (e.g., fluorine, chlorine, bromine, iodine), nitro group, cyano group, the foregoing alkyl group, alkoxy group such as methoxy group, ethoxy group, hydroxyethoxy group, propoxy group, hydroxypropoxy group, n-butoxy group, isobutoxy group, sec-butoxy group and t-butoxy group, alkoxycarbonyl group such as methoxycarbonyl group and ethoxycarbonyl group, aralkyl group such as benzyl group, phenethyl group and cumyl group, aralkyloxy group, acyl group such as formyl group, acetyl group, butyryl group, benzoyl group, cyanamyl group and valeryl group, acyloxy group such as butyryloxy group, the foregoing alkenyl group, alkenyloxy group such as vinyloxy group, propenyloxy group, allyloxy group and butenyloxy group, the foregoing aryl group, aryloxy group such as phenoxy group, and aryloxycarbonyl group such as benzoyloxy group.

Preferred examples of the acid-decomposable group R3a include tertiary alkylester group, tertiary alkylether group, tertiary alkylcarbonate group, and —C(=O) O—C($R_{10a}$)($R_{11a}$)$OR_{12a}$ in which $R_{10a}$ and $R_{11a}$ each represent a hydrogen atom or $C_{1-4}$ alkyl group, and $R_{12a}$ represents a $C_{1-4}$ alkyl group. In this arrangement, the effect of the present invention can be exerted more remarkably.

Preferred examples of the foregoing alkyl group include $C_{1-4}$ alkyl group such as methyl group, ethyl group, propyl group, n-butyl group, sec-butyl group and t-butyl group. Examples of the tertiary alkyl group in the foregoing tertiary alkylester group, tertiary alkylether group, tertiary alkylcarbonate group include t-butyl group, t-pentyl group, and t-hexyl group.

Specific examples of the group represented by the general formula (Ia) will be given below, but the present invention should not be construed as being limited thereto.

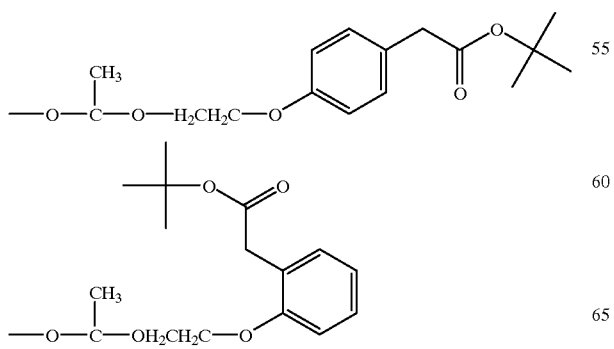

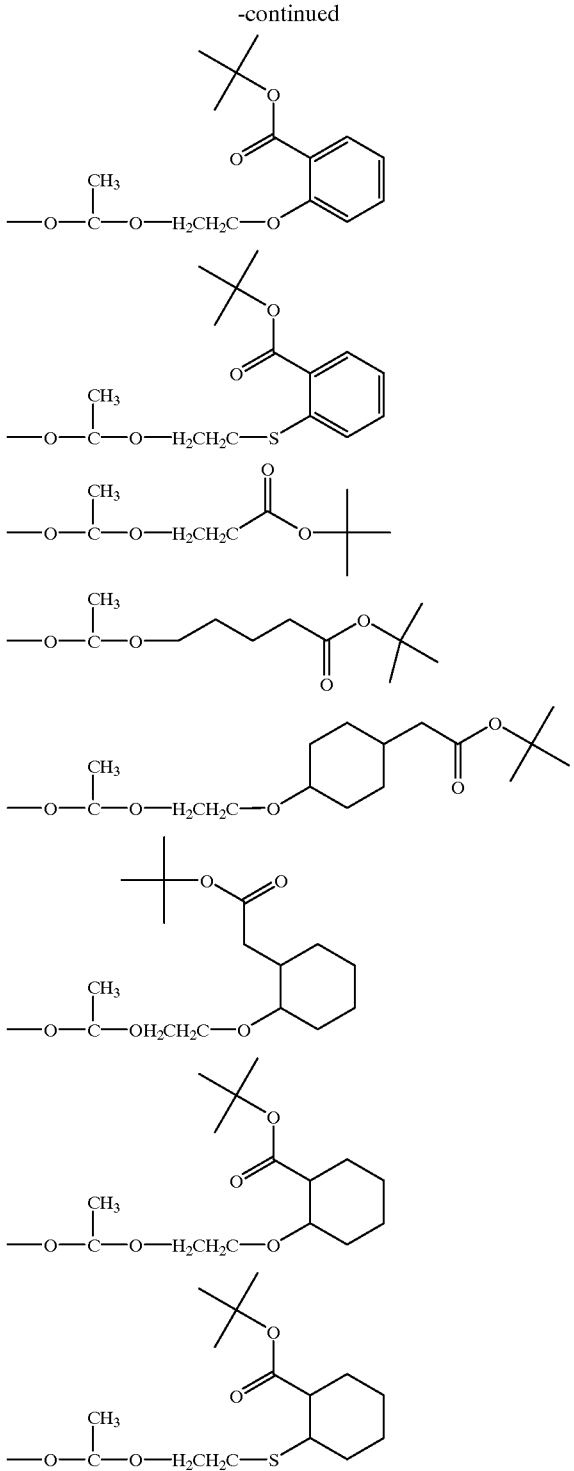

Examples of the compound having a group represented by the foregoing general formula (Ia) which decomposes by the action of an acid to enhance its solubility in an alkaline developing solution include alkali-soluble resin (polymer type dissolution inhibitive compound) and non-polymer type dissolution inhibitive compound containing a group represented by the general formula (Ia).

The resin (a) having a group represented by the foregoing general formula (Ib) which decomposes by the action of an acid to enhance its solubility in an alkaline developing solution will be further described hereinafter.

Examples of the alkyl group $R_{1b}$ or $R_{2b}$ in the general formula (Ib) include $C_{1-4}$ alkyl group such as methyl group, ethyl group, n-propyl, i-propyl, butyl group, isobutyl group, sec-butyl group and t-butyl group.

Preferred examples of the divalent organic group represented by Wb include straight-chain, branched or cyclic alkylene, arylene, heteroarylene and aralkylene, which may have substituents, —S—, —C(=O)—, —N($R_{4b}$)—, —SO—, —SO$_2$—, —CO$_2$—, N($R_{4b}$)SO$_2$—, and divalent group obtained by combining two or more of these groups. $R_{4b}$ represents a hydrogen atom or alkyl group (Specific examples of the alkyl group represented by $R_{4b}$ include those described with reference to $R_{1b}$).

The foregoing chain alkyl group $R_{3b}$ having from 11 to 20, preferably from 11 to 18 carbon atoms may be straight-chain or branched. Examples of such a chain alkyl group include n-undecyl group, i-undecyl group, n-dodecyl group, i-dodecyl group, n-tridecyl group, i-tridecyl group, n-tetradecyl group, i-tetradecyl group, n-pentadecyl group, i-pentadecyl group, n-hexadecyl group, i-hexadecyl group, n-heptadecyl group, i-heptadecyl group, n-octadecyl group, i-octadecyl group, n-nanodecyl group, and i-nonadecyl group.

The foregoing cyclic alkyl group $R_{3b}$ having from 11 to 20, preferably from 11 to 18 carbon atoms may be a cyclic alkyl group which has substituents even if the cycle is formed by up to 20 carbon atoms. Examples of such a cyclic group include cycloundecyl group, cyclododecyl group, cyclotridecyl group, cyclotridecyl group, cyclotetradecyl group, cyclopentadecyl group, cyclohexadecyl group, cycloheptadecyl group, cyclooctadecyl group, cyclononadecyl group, 4-cyclohexylcyclohexyl group, 4-n-hexylcyclohexyl group, pentanylcyclohexyl group, hexyloxycyclohexyl group, and pentanyloxycyclohexyl group. Substituted cyclic alkyl groups other than these groups may be used so far as they satisfy the foregoing requirements.

Examples of the foregoing aryl group $R_{3b}$ having from 11 to 30, preferably from 11 to 25 carbon atoms, include 4-cyclopentylphenyl group, 4-cyclohexylphenyl group, 4-cycloheptenylphenyl group, 4-cyclooctanylphenyl group, 2-cyclopentylphenyl group, 2-cyclohexylphenyl group, 2-cycloheptenylphenyl group, 2-cyclooctanylphenyl group, 3-cyclopentylphenyl group, 3-cyclohexylphenyl group, 3-cycloheptenylphenyl group, 3-cyclooctanylphenyl group, 4-cyclopentyloxyphenyl group, 4-cyclohexyloxyphenyl group, 4-cycloheptenyloxyphenyl group, 4-cyclooctanyloxyphenyl group, 2-cyclopentyloxyphenyl group, 2-cyclohexyloxyphenyl group, 2-cycloheptenyloxyphenyl group, 2-cyclooctanyloxyphenyl group, 3-cyclopentyloxyphenyl group, 3-cyclohexyloxyphenyl group, 3-cycloheptenyloxyphenyl group, 3-cyclooctanyloxyphenyl group, 4-n-pentylphenyl group, 4-n-hexylphenyl group, 4-n-heptenylphenyl group, 4-n-octanylphenyl group, 2-n-pentylphenyl group, 2-n-hexylphenyl group, 2-n-heptenylphenyl group, 2-n-octanylphenyl group, 3-n-pentylphenyl group, 3-n-hexylphenyl group, 3-n-heptenylphenyl group, 3-n-octanylphenyl group, 2,6-di-isopropylphenyl group, 2,3-di-isopropylphenyl group, 2,4-di-isopropylphenyl group, 3,4-di-isopropylphenyl group, 3,6-di-t-butylphenyl group, 2,3-di-t-butylphenyl group, 2,4-di-t-butylphenyl group, 3,4-di-t-butylphenyl group, 2,6-di-n-butylphenyl group, 2,3-di-n-butylphenyl group, 2,4-di-n-butylphenyl group, 3,4-di-n-butylphenyl group, 2,6-di-i-butylphenyl group, 2,3-di-i-butylphenyl group, 2,4-di-i-butylphenyl group, 3,4-di-i-butylphenyl group, 2,6-di-t-amylphenyl group, 2,3-di-t-amylphenyl group, 2,4-di-t-amylphenyl group, 3,4-di-t-amylphenyl group, 2,6-di-i-amylphenyl group, 2,3-di-i-amylphenyl group, 2,4-di-i-amylphenyl group, 3,4-di-i-amylphenyl group, 2,6-di-n-pentylphenyl group, 2,3-di-n-pentylphenyl group, 2,4-di-n-pentylphenyl group, 3,4-di-n-pentylphenyl group, 4-adamantylphenyl group, 2-adamantylphenyl group, 4-isoboronylphenyl group, 3-isoboronylphenyl group, 2-isoboronylphenyl group, 4-cyclopentyloxyphenyl group, 4-cyclohexyloxyphenyl group, 4-cycloheptenyloxyphenyl group, 4-cyclooctanyloxyphenyl group, 2-cyclopentyloxyphenyl group, 2-cyclohexyloxyphenyl group, 2-cycloheptenyloxyphenyl group, 2-cyclooctanyloxyphenyl group, 3-cyclopentyloxyphenyl group, 3-cyclohexyloxyphenyl group, 3-cycloheptenyloxyphenyl group, 3-cyclooctanyloxyphenyl group, 4-n-pentyloxyphenyl group, 4-n-hexyloxyphenyl group, 4-n-heptenyloxyphenyl group, 4-n-octanyloxyphenyl group, 2-n-pentyloxyphenyl group, 2-n-hexyloxyphenyl group, 2-n-heptenyloxyphenyl group, 2-n-octanyloxyphenyl group, 3-n-pentyloxyphenyl group, 3-n-hexyloxyphenyl group, 3-n-heptenyloxyphenyl group, 3-n-octanyloxy phenyl group, 2,6-di-isopropyloxyphenyl group, 2,3-di-isopropyloxyphenyl group, 2,4-di-isopropyloxyphenyl group, 3,4-di-isopropyloxyphenyl group, 2,6-di-t-butyloxyphenyl group, 2,3-di-t-butyloxyphenyl group, 2,4-di-t-butyloxyphenyl group, 3,4-di-t-butyloxyphenyl group, 2,6-di-n-butyloxyphenyl group, 2,3-di-n-butyloxyphenyl group, 2,4-di-n-butyloxyphenyl group, 3,4-di-n-butyloxyphenyl group, 2,6-di-i-butyloxyphenyl group, 2,3-di-i-butyloxyphenyl group, 2,4-di-i-butyloxyphenyl group, 3,4-di-i-butyloxyphenyl group, 2,6-di-t-amyloxyphenyl group, 2,3-di-t-amyloxyphenyl group, 2,4-di-t-amyloxyphenyl group, 3,4-di-t-amyloxyphenyl group, 2,6-di-i-amyloxyphenyl group, 2,3-di-i-amyloxyphenyl group, 2,4-di-i-amyloxyphenyl group, 3,4-di-i-amyloxyphenyl group, 2,6-di-n-pentyloxyphenyl group, 2,3-di-n-pentyloxyphenyl group, 2,4-di-n-pentyloxyphenyl group, 3,4-di-n-pentyloxyphenyl group, 4-adamantyloxyphenyl group, 3-adamantyloxyphenyl group, 2-adamantyloxyphenyl group, 4-isoboronyloxyphenyl group, 3-isoboronyloxyphenyl group, and 2-isoboronyloxyphenyl group. These groups may be further substituted so far they satisfy the foregoing requirements. The present invention is not limited to these groups.

Examples of the aralkyl group $R_3$ having from 12 to 30, preferably from 12 to 25 carbon atoms include 4-cyclopentylphenylethyl group, 4-cyclohexylphenylethyl group, 4-cycloheptenylphenylethyl group, 4-cyclooctanylphenylethyl group, 2-cyclopentylphenylethyl group, 2-cyclohexylphenyl ethyl group, 2-cycloheptenylphenylethyl group, 2-cyclooctanyl phenylethyl group, 3-cyclopentylphenylethyl group, 3-cyclohexylphenylethyl group, 3-cycloheptenylphenylethyl group, 3-cyclooctanylphenylethyl group, 4-cyclopentyloxy phenylethyl group, 4-cyclohexyloxyphenylethyl group, 4-cycloheptenyloxyphenylethyl group, 4-cyclooctanyloxyphenyl ethyl group, 2-cyclopentyloxyphenylethyl group, 2-cyclohexyloxyphenylethyl group, 2-cycloheptenyloxy phenylethyl group, 2-cyclooctanyloxyphenylethyl group, 3-cyclopentyloxyphenylethyl group, 3-cyclohexyloxyphenylethyl group, 3-cycloheptenyloxyphenylethyl group, 3-cyclooctanyloxyphenylethyl group, 4-n-pentylphenyl ethyl group, 4-n-hexylphenylethyl group, 4-n-heptenylphenyl ethyl group, 4-n-octanylphenylethyl group, 2-n-pentylphenyl ethyl group, 2-n-hexylphenylethyl group, 2-n-heptenylphenyl ethyl group, 2-n-octanylphenylethyl group, 3-n-pentylphenyl ethyl group, 3-n-hexylphenylethyl group, 3-n-heptenylphenyl ethyl group, 3-n-octanylphenylethyl group, 2,6-di-isopropyl phenylethyl group, 2,3-di-isopropylphenylethyl group, 2,4-di-isopropylphenylethyl group, 3,4-di-isopropylphenylethyl group, 2,6-di-t-butylphenylethyl group, 2,3-di-t-butyl phenylethyl group, 2,4-di-t-butylphenylethyl group, 3,4-di-t-butylphenylethyl group, 2,6-di-n-butylphenylethyl group, 2,3-di-n-butylphenylethyl group, 2,4-di-n-butylphenylethyl group, 3,4-di-n-butylphenylethyl group, 2,6-di-i-butyl phenylethyl group, 2,3-di-i-butylphenylethyl group, 2,4-di-i-butylphenylethyl group, 3,4-di-i-butylphenylethyl group, 2,6-di-t-amylphenylethyl group, 2,3-di-t-amylphenylethyl group, 2,4-di-t-amylphenylethyl group, 3,4-di-t-amylphenylethyl group, 2,6-di-i-amylphenylethyl group, 2,3-di-i-amylphenylethyl group, 2,4-di-i-amylphenylethyl group, 3,4-di-i-amylphenylethyl group, 2,6-di-n-pentylphenylethyl group, 2,3-di-n-pentylphenylethyl group, 2,4-di-n-pentylphenylethyl group, 3,4-di-n-pentylphenylethyl group, 4-adamantylphenylethyl group, 3-adamantylphenylethyl group, 2-adamantylphenylethyl group, 4-isoboronylphenylethyl group, 3-isoboronylphenylethyl group, 2-isoboronylphenylethyl group, 4-cyclopentyloxyphenylethyl group, 4-cyclohexyloxyphenylethyl group, 4-cycloheptenyloxyphenylethyl group, 4-cycloctanyloxyphenylethyl group, 2-cyclopentyloxyphenylethyl group, 2-cyclohexyloxyphenylethyl group, 2-cycloheptenyloxyphenylethyl group, 2-cycloctanyloxyphenylethyl group, 3-cyclopentyloxyphenylethyl group, 3-cyclohexyloxyphenylethyl group, 3-cycloheptenyloxyphenylethyl group, 3-cycloctanyloxyphenylethyl group, 4-n-pentyloxyphenylethyl group, 4-n-hexyloxyphenylethyl group, 4-n-heptenyloxyphenylethyl group, 4-n-octanyloxyphenylethyl group, 2-n-pentyloxyphenylethyl group, 2-n-hexyloxyphenylethyl group, 2-n-heptenyloxyphenylethyl group, 2-n-octanyloxyphenylethyl group, 3-n-pentyloxyphenylethyl group, 3-n-hexyloxyphenylethyl group, 3-n-heptenyloxyphenylethyl group, 3-n-octanyloxyphenylethyl group, 2,6-di-isopropyloxyphenylethyl group, 2,3-di-isopropyloxyphenylethyl groups 2,4-di-isopropyloxyphenylethyl group, 3,4-di-isopropyloxyphenylethyl group, 2,6-di-t-butyloxyphenylethyl group, 2,3-di-t-butyloxyphenylethyl group, 2,4-di-t-butyloxyphenylethyl group, 3,4-di-t-butyloxyphenylethyl group, 2,6-di-n-butyloxyphenylethyl group, 2,3-di-n-butyloxyphenylethyl group, 2,4-di-n-butyloxyphenylethyl group, 3,4-di-n-butyloxyphenylethyl group, 2,6-di-i-butyloxyphenylethyl group, 2,3-di-i-butyloxyphenylethyl group, 2,4-di-i-butyloxyphenylethyl group, 3,4-di-i-butyloxyphenylethyl group, 2,6-di-t-amyloxyphenylethyl group, 2,3-di-t-amyloxyphenylethyl group, 2,4-di-t-amyloxyphenylethyl group, 3,4-di-t-amyloxyphenylethyl group, 2,6-di-i-amyloxyphenylethyl group, 2,3-di-i-amyloxyphenylethyl group, 2,4-di-i-amyloxyphenylethyl group, 3,4-di-i-amyloxyphenylethyl group, 2,6-di-n-pentyloxyphenylethyl group, 2,3-di-n-pentyloxyphenylethyl group, 2,4-di-n-pentyloxyphenylethyl group, 3,4-di-n-pentyloxyphenylethyl group, 4-adamantyloxyphenylethyl group, 3-adamantyloxyphenylethyl group, 2-adamantyloxyphenylethyl group, 4-isoboronylphenylethyl group, 3-isoboronyloxyphenylethyl group, 2-isoboronyloxyphenylethyl group, and groups obtained by substituting the alkyl group in these groups by methyl group, propyl group, butyl group or the like.

Examples of the substituents on these groups include hydroxyl group, halogen atom (e.g., fluorine, chlorine, bromine, iodine), nitro group, cyano group, the foregoing alkyl group, alkoxy group such as methoxy group, ethoxy group, hydroxyethoxy group, propoxy group, hydroxypropoxy group, n-butoxy group, isobutoxy group, sec-butoxy group and t-butoxy group, alkoxycarbonyl group such as methoxycarbonyl group and ethoxycarbonyl group, aralkyl group such as benzyl group, phenethyl group and cumyl group, aralkyloxy group, acyl group such as formyl group, acetyl group, butyryl group, benzoyl group, cyanamyl group and valeryl group, acyloxy group such as butyryloxy group, the foregoing alkenyl group, alkenyloxy group such as vinyloxy group, propenyloxy group, allyloxy group and butenyloxy group, the foregoing aryl group, aryloxy group such as phenoxy group, and aryloxycarbonyl group such as benzoyloxy group.

The substituent for $R_{3b}$ is preferably a $C_{11-25}$ aryl group or $C_{12-25}$ aralkyl group. These substituents may contain substituents themselves so far the number of carbon atoms in the substituted aryl group or aralkyl group falls within the above defined range.

Specific examples of the group represented by the general formula (Ib) will be given below, but the present invention should not be construed as being limited thereto.

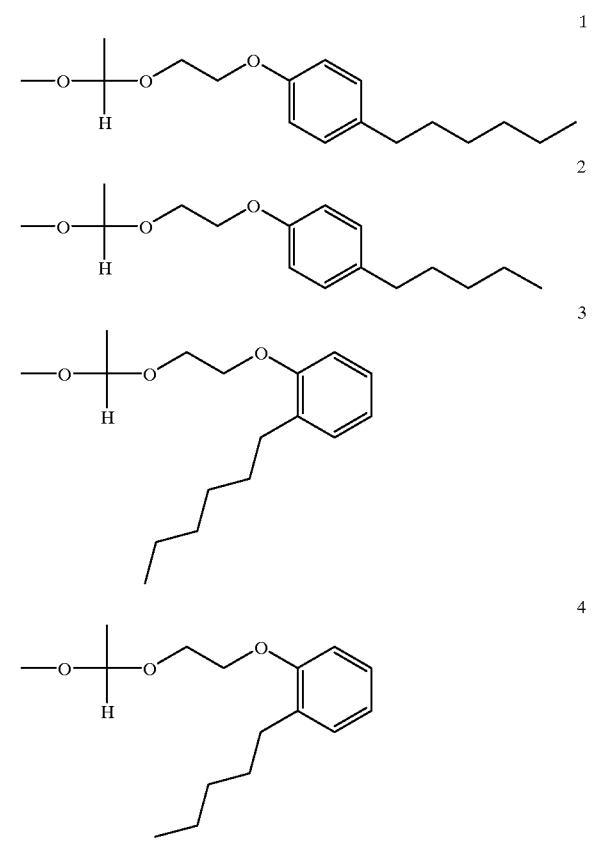

-continued
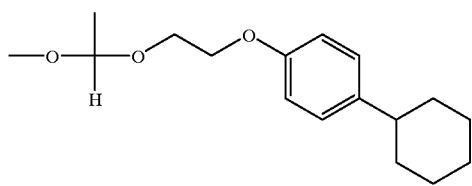
5
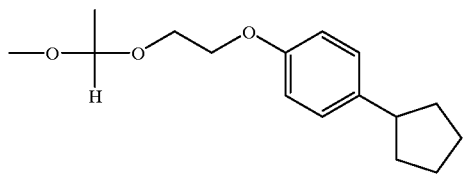
6
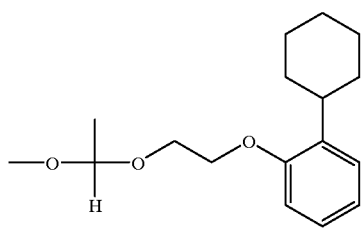
7
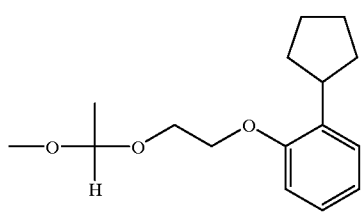
8
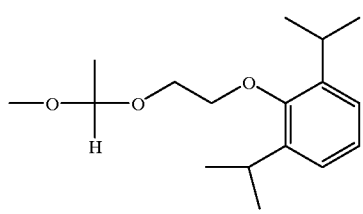
9
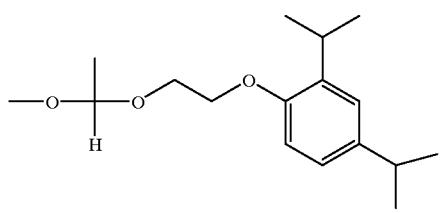
10
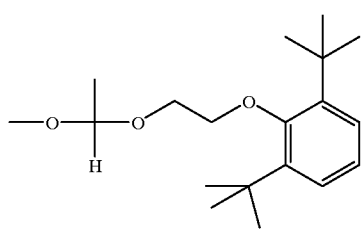
11
-continued
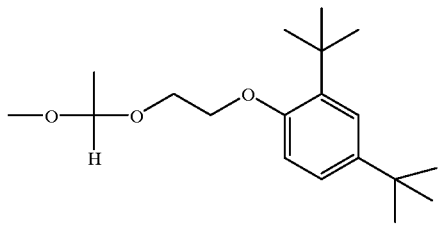
12
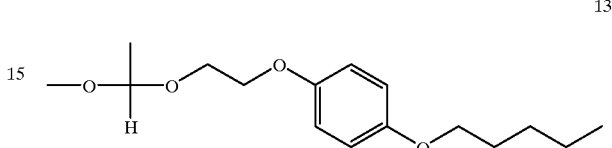
13
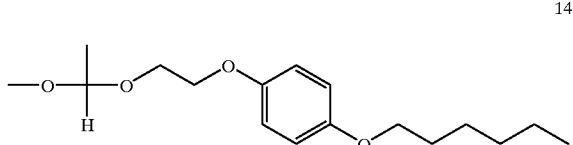
14
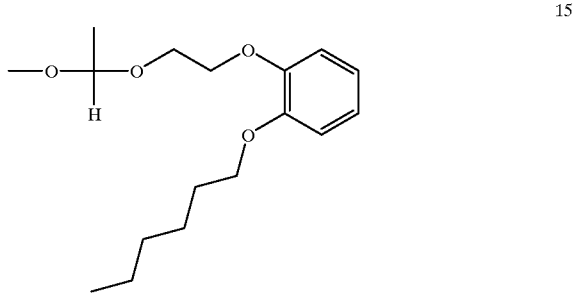
15
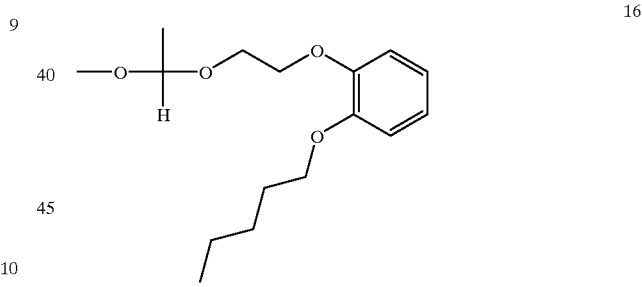
16
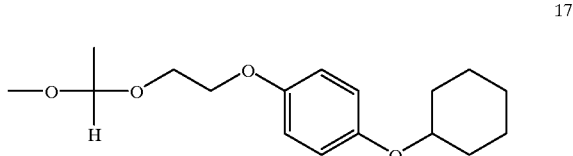
17
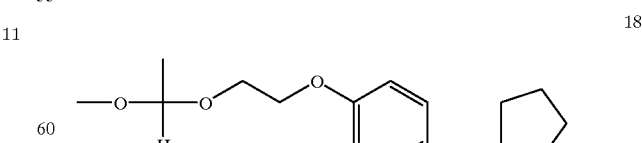
18

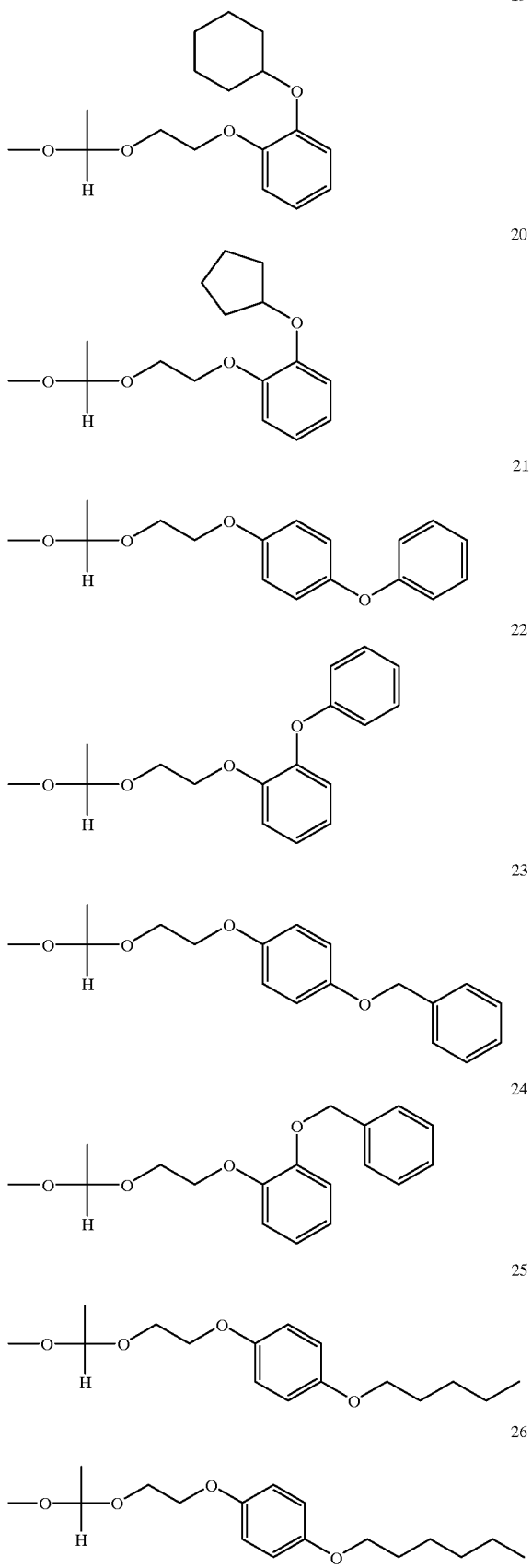
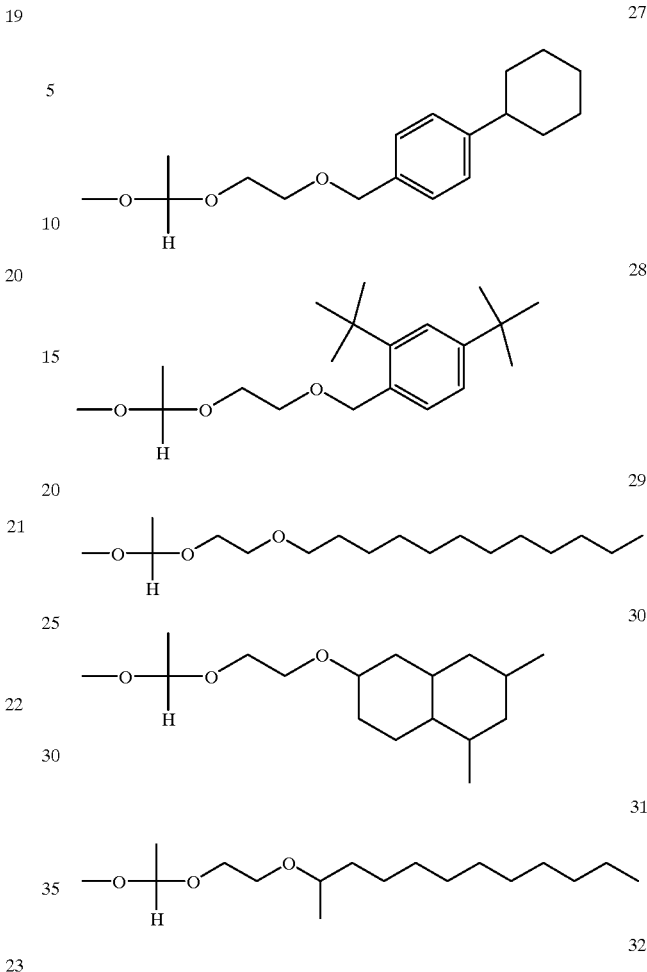

Preferred embodiments of the first positive photosensitive composition according to the present invention will be given below.

(1) Photo-acid generator and polymer type dissolution inhibitive compound;

(2) Photo-acid generator, non-polymer type dissolution inhibitive compound and alkali-soluble resin;

(3) Photo-acid generator, polymer type dissolution inhibitive compound and non-polymer type dissolution inhibitive compound; and (4) Photo-acid generator, polymer type dissolution inhibitive compound, non-polymer type dissolution inhibitive compound and alkali-soluble resin The polymer type dissolution inhibitive compound will be further described hereinafter.

The term "polymer type dissolution inhibitive compound" as used herein is meant to indicate a compound having a structure comprising a compound having a molecular weight distribution obtained by the polymerization of monomers and having an acid-decomposable group represented by the general formula (Ia) incorporated therein, which becomes alkali-soluble by the action of an acid.

As such a polymer type dissolution inhibitive compound there may be used a resin having a group represented by the general formula (Ia) incorporated therein in either or both its main chain and side chains, preferably in its side chains.

As the matrix resin to which the group represented by the general formula (Ia) is connected as a side chain there can be used an alkali-soluble resin having —OH or —COOH group, preferably —R⁰—COOH or —Ar—OH group, incorporated therein in its side chains. Examples of such a matrix resin include alkali-soluble resins free of acid-decomposable group described later. R⁰ represents a divalent or higher aliphatic or aromatic hydrocarbon group which may contain substituents. —Ar— represents a divalent monocyclic or polycyclic aromatic group which may contain substituents.

Examples of the divalent or higher aliphatic group R⁰ which may contain substituents include straight-chain alkylene group such as methylene group, ethylene group, propylene group and butylene group, branched alkylene group such as methyl ethylene group, methyl propylene group and methyl butylene group, and cyclic alkylene group such as cyclohexylene group and cyclopentylene group. Examples of the aromatic hydrocarbon group R⁰ include phenylene group, naphthylene group, and anthranylene group. These groups may be further substituted.

Examples of the divalent or higher monocyclic or polycyclic aromatic group —Ar— which may contain substituents include phenylene group, naphthylene group and anthranylene group. These groups may be further substituted.

A preferred example of the matrix resin employable herein is an alkali-soluble resin having a phenolic hydroxyl group.

The alkali-soluble resin having a phenolic hydroxyl group to be used herein is preferably a copolymer containing a repeating unit corresponding to o-, m- or p-hydroxystyrene (generically referred to as "hydroxystyrene") or o-, m- or p-hydroxy-α-methylstyrene (generically referred to as "hydroxy-α-methylstyrene") in an amount of at least 30 mol %, preferably not less than 50 mol %, or its homopolymer, or a resin having the benzene nucleus in the repeating unit partially hydrogenated, preferably p-hydroxystyrene homopolymer.

Examples of monomers other than hydroxystyrene and hydroxy-α-methylstyrene which are copolymerized to prepare the foregoing copolymer include acrylic acid esters, methacrylic acid esters, acrylamides, methacrylamides, acrylonitrile, methacrylonitrile, maleic anhydride, styrene, α-methylstyrene, acetoxystyrene, and alkoxystyrenes. Preferred among these monomers are styrene, acetoxystyrene, and t-butoxystyrene.

In the present invention, the content of the repeating unit having a group represented by the general formula (Ia) in the foregoing resin is preferably from 5 mol % to 50 mol %, more preferably from 5 mol % to 30 mol %, based on the total amount of repeating units.

In the present invention, the foregoing polymer type dissolution inhibitive compound may comprise other acid-decomposable groups incorporated therein besides the group represented by the foregoing general formula (Ia).

The resin containing a group represented by the foregoing general formula (Ia) can be obtained by a process which comprises synthesizing the corresponding vinyl ether, and then reacting the vinyl ether with a phenolic hydroxyl group-containing alkali-soluble resin dissolved in a proper solvent such as tetrahydrofuran in any known manner. The foregoing reaction is normally effected in the presence of an acidic catalyst, preferably acidic ion exchange resin, hydrochloric acid, p-toluenesulfonic acid, or a base such as pyridinium tosylate. The foregoing corresponding vinyl ether can be synthesized, e.g., by nucleophilic substitution reaction of active starting materials such as chloroethyl vinyl ether.

The weight-average molecular amount of the polymer containing a group represented by the foregoing general formula (Ia) is preferably from 3,000 to 80,000, more preferably from 7,000 to 50,000. The molecular weight distribution (Mw/Mn) of the polymer generally falls within a range of from 1.01 to 4.0, preferably from 1.05 to 3.00. In order to obtain a polymer having such a molecular weight distribution, a method such as anionic polymerization and radical polymerization is preferably employed.

Specific examples of the structural formula of such a polymer type dissolution inhibitive compound will be given below, but the present invention should not be construed as being limited thereto.

A-1a

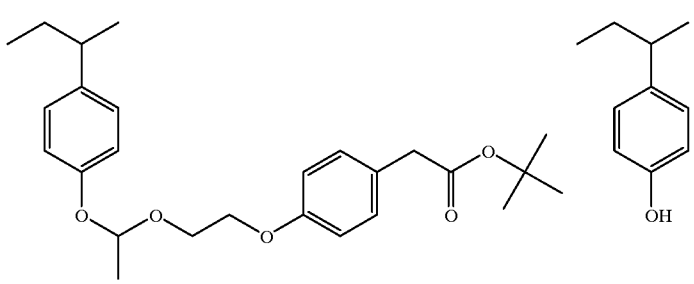

-continued
A-2a
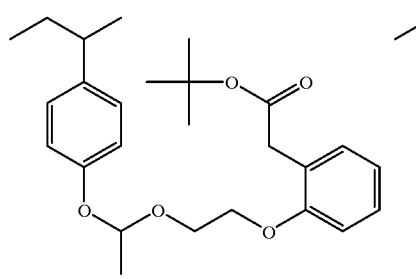 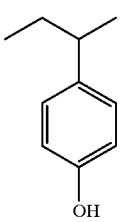
A-3a
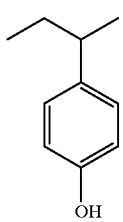
A-4a
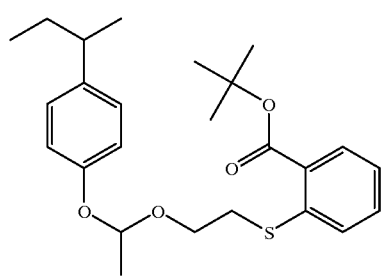 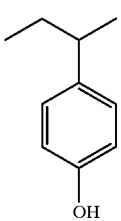
A-5a
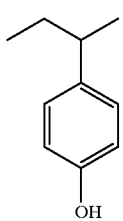
A-6a
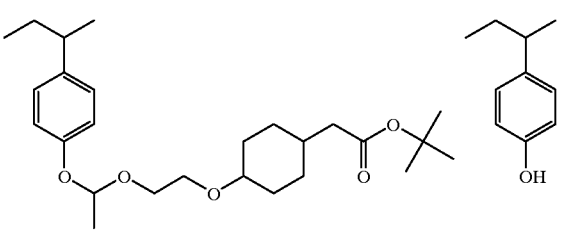 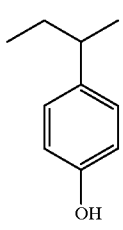
A-7a
A-8a
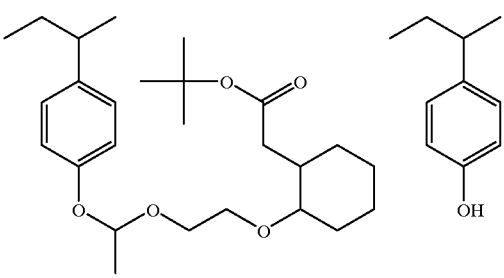
A-9a
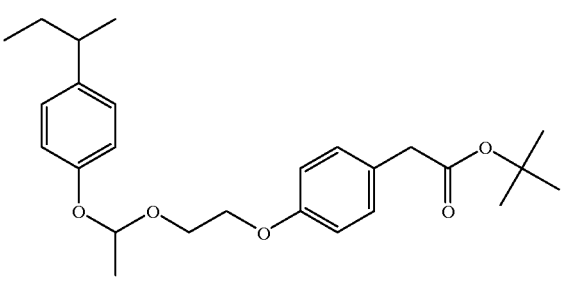 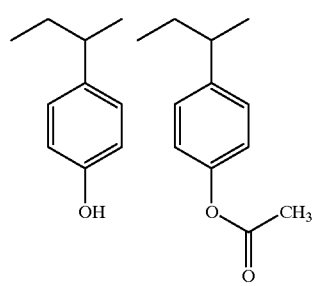

-continued

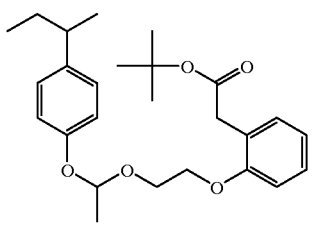
A-10a

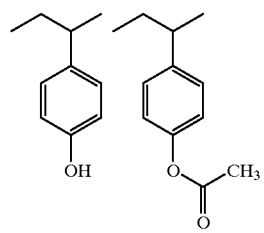

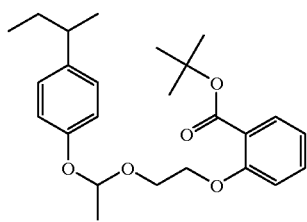
A-11a

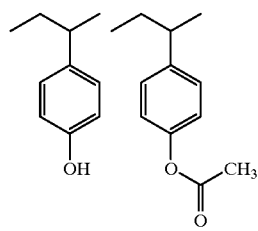

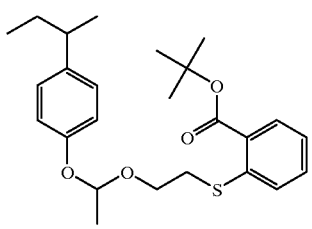
A-12a

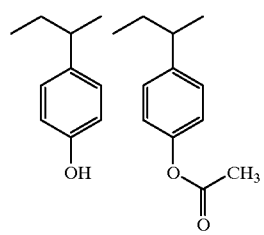

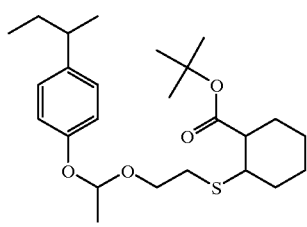
A-13a

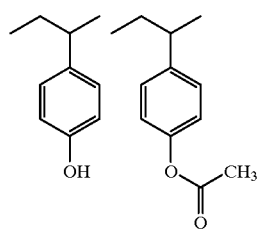

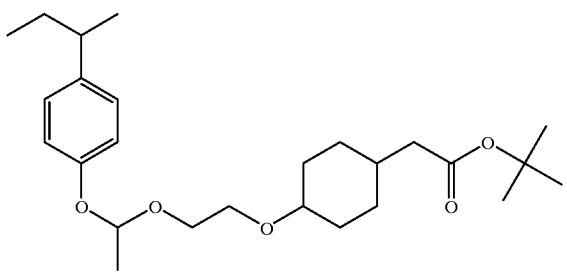
A-14a

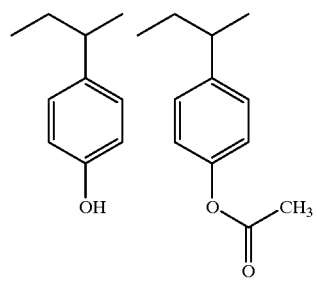

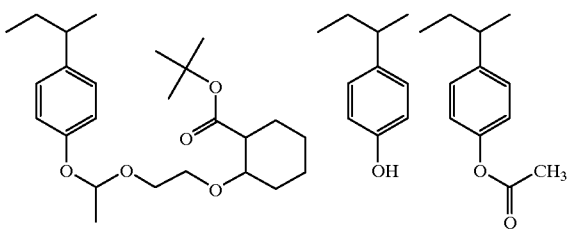
A-15a

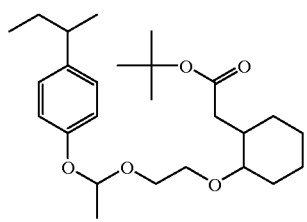
A-16a

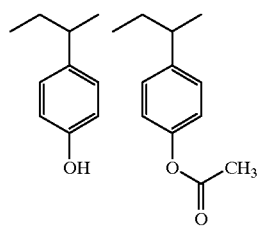

The non-polymer type dissolution inhibitive compound will be further described hereinafter.

The term "non-polymer type dissolution inhibitive compound" as used herein is meant to indicate a compound having a structure comprising a singly-structured compound with a predetermined molecular weight of not more than 3,000 having a group represented by the foregoing general formula (Ia) incorporated therein, which becomes alkali-soluble by the action of an acid.

The foregoing non-polymer type dissolution inhibitive compound employable herein contains at least one group represented by the foregoing general formula (Ia) as an acid-decomposable group.

As such a non-polymer type dissolution inhibitive compound there can be used a compound having in its structure at least two acid-decomposable groups, said acid-decomposable groups having at least 10, preferably at least 11, more preferably at least 12 connecting atoms excluding the acid-decomposable groups interposed therebetween at the longest distance or compound having in its structure at least three acid-decomposable groups, said acid-decomposable groups having at least 9, preferably at least 10, more preferably at least 11 connecting atoms excluding the acid-decomposable groups interposed therebetween at the longest distance to advantage.

The non-polymer type dissolution inhibitive compound inhibits the dissolution of an alkali-soluble resin in an alkali but, upon exposure to light, generates an acid by which the acid-decomposable group is deprotected to accelerate the dissolution of the alkali-soluble resin in an alkali. JP-A-63-27829 and JP-A-3-198059 disclose dissolution inhibitive compounds having naphthalene, biphenyl and diphenylcycloalkane as skeleton compounds. However, these dissolution inhibitive compounds exhibit a small capacity of inhibiting dissolution in an alkali-soluble resin and thus leave something to be desired in profile and resolution.

A preferred example of the non-polymer type dissolution inhibitive compound employable herein is a single structure compound with a molecular weight of not more than 3,000 containing three or more alkali-soluble groups per molecule, not less than half said alkali-soluble groups being protected by an acid-decomposable group represented by the general formula (Ia). Such a non-polymer type dissolution inhibitive compound having alkali-soluble groups left therein exhibits an enhanced solubility in a solvent. Thus, the use of such a non-polymer type dissolution inhibitive compound adds to the effect of the present invention to advantage.

In the present invention, the upper limit of the number of the foregoing connecting atoms is preferably 50, more preferably 30.

In the present invention, the non-polymer type dissolution inhibitive compound containing not less than 3, preferably not less than 4 acid-decomposable groups, or two acid-decomposable groups which are separated from each other at a certain distance exhibits a remarkably enhanced capacity of inhibiting dissolution in an alkali-soluble resin.

The distance between the acid-decomposable groups is represented by the number of connecting atoms provided interposed therebetween excluding the acid-decomposable groups. For compounds represented by the following general formulae (1) and (2), the distance between the acid-decomposable groups is 4 connecting atoms. For a compound represented by the following general formula (3), the distance between the acid-decomposable groups is 12 connecting atoms.

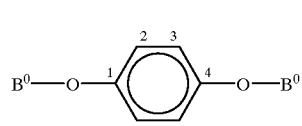
(1)

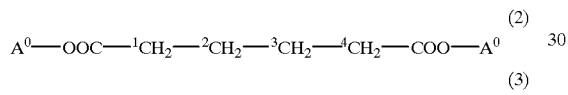
(2)

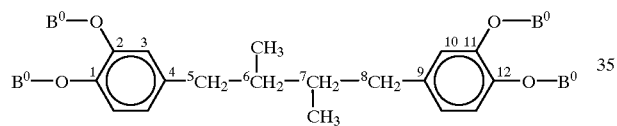
(3)

Acid-decomposable group: —COO—$A^0$, —O—$B^0$

The non-polymer type dissolution inhibitive compound of the present invention may having a plurality of acid-decomposable groups on one benzene ring. Preferably, the non-polymer type dissolution inhibitive compound of the present invention is a compound comprising a skeleton having one acid-decomposable group on one benzene ring. The molecular weight of the non-polymer type dissolution inhibitive compound of the present invention is not more than 3,500, preferably from 500 to 3,000, more preferably from 1,000 to 2,500. If the molecular weight of the non-polymer type dissolution inhibitive compound of the present invention falls within the above defined range, it gives a high resolution to advantage.

Preferred examples of the non-polymer type dissolution inhibitive compound include polyhydroxy compounds having phenolic OH groups partially or entirely protected by a group represented by the foregoing general formula (Ia) as described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application No. 3-33229, Japanese Patent Application No. 3-230790, Japanese Patent Application No. 3-320438, Japanese Patent Application No. 4-25157, Japanese Patent Application No. 4-52732, Japanese Patent Application No. 4-103215, Japanese Patent Application No. 4-104542, Japanese Patent Application No. 4-107885, Japanese Patent Application No. 4-1078889, and Japanese Patent Application No. 4-152195.

More specifically, the compounds represented by the following formulae (I) to (XVI) can be exemplified.

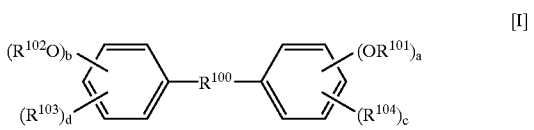
[I]

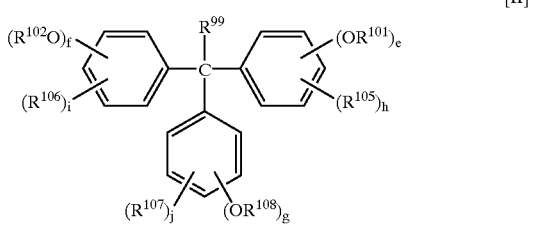
[II]

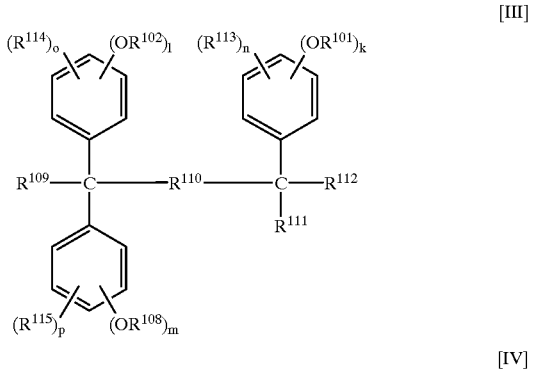
[III]

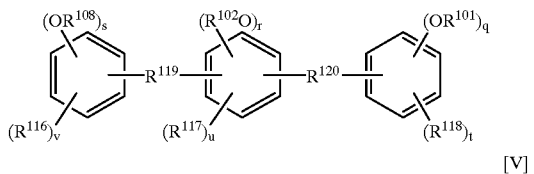
[IV]

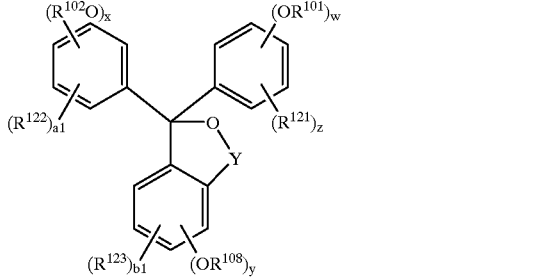
[V]

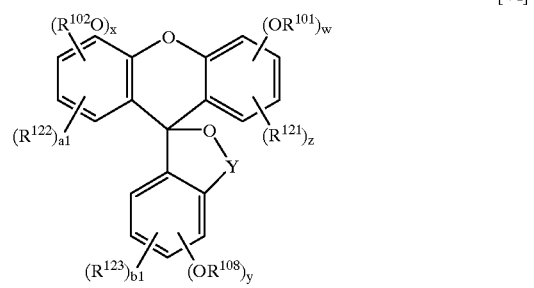
[VI]

[VII]

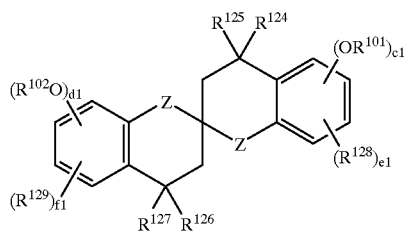

[VIII]

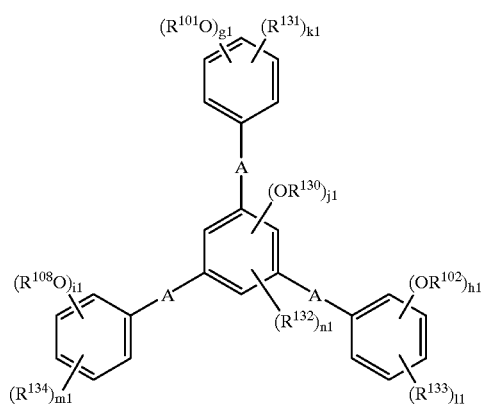

[IX]

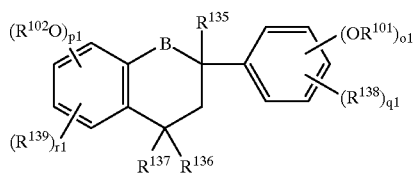

[X]

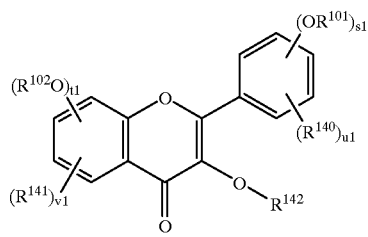

[XI]

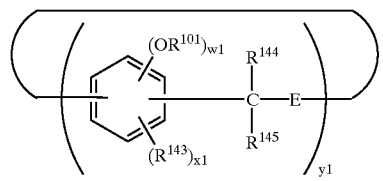

[XII]

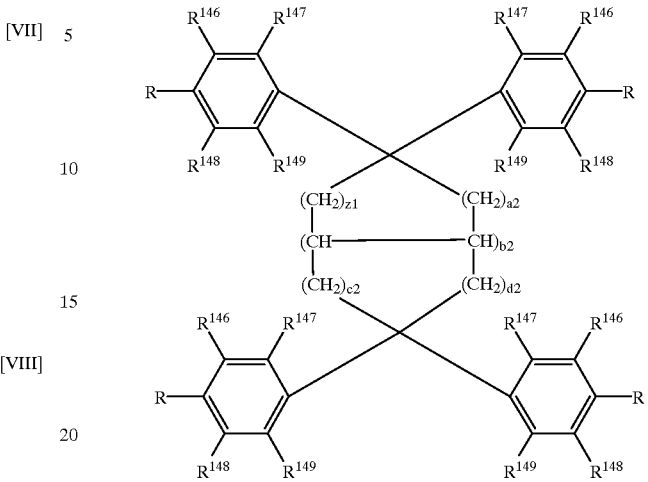

In the above formulae, $R^{101}$, $R^{102}$, $R^{108}$, and $R^{130}$ may be the same or different and each represents a hydrogen atom or $-C(R_{1a})(R_{2a})-O-W_a-R_{3a}$ wherein $R_{1a}$, $R_{2a}$, $W_a$, $R_{3a}$ have the same meanings as defined above;

$R^{100}$ represents $-CO-$, $-COO-$, $-NHCONH-$, $-NHCOO-$, $-O-$, $-S-$, $-SO-$, $-SO_2-$, $-SO_3-$, or a group represented by

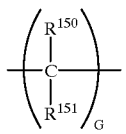

where

G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, $-OH$, $-COOH$, $-CN$, a halogen atom, $-R^{152}-COOR^{153}$, or $-R^{154}-OH$, $R^{152}$ and $R^{154}$ each represents an alkylene group, and $R^{153}$ represents a hydrogen atom, an alkyl group, an aryl group, or an aralkyl group;

$R^{99}$, $R^{103}$ $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R^{155})(R^{156})$ (where $R^{155}$ and $R^{156}$ each represents H, an alkyl group, or an aryl group);

$R^{110}$ represents a single bond, an alkylene group, or a group represented by

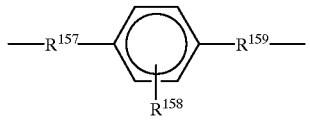

where $R^{157}$ and $R^{159}$ may be the same or different and each represents a single bond, an alkylene group, —O—, —S—, —CO—, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group;

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom or —C($R_{1a}$)($R_{2a}$)—O—$W_a$—$R_{3a}$ wherein $R_{1a}$, $R_{2a}$, $W_a$, $R_{3a}$ have the same meanings as defined above or the group represented by

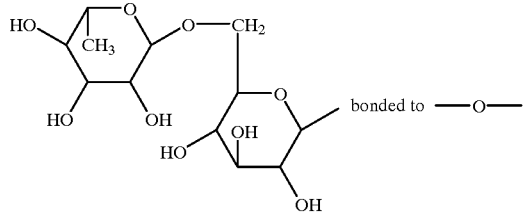

bonded to —O—

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents —CO— or —$SO_2$—;

Z and B each represents a single bond or —O—;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2, and d2 each represents 0 or an integer of 1 to 3;

at least one of z1, a2, c2, and d2 is 1 or larger; y1 is an integer of 3 to 8;

(a+b), (e+f+g), (k+l+m), (q+r+s), (w+x+y), (c1+d1), (g1+h1+i1+j), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula [V], (w+z) and (x+a1) each is 5 or smaller; and (a+c), (b+d), (e+h), (f+i), (g+j), (k+n), (l+o), (m+p), (q+t), (s+v), (g1+k1), (h1+m1), (o1+q1), and (s1+u1) each is 5 or smaller.

(XIII)

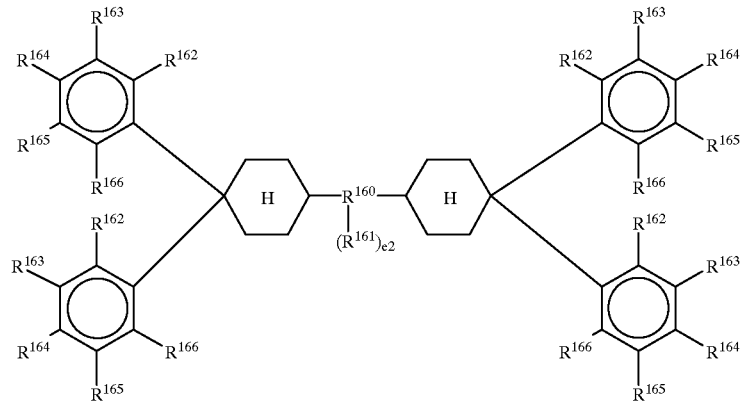

In formula (XIII), $R^{160}$ represents an organic group, a single bond, —S—, —SO—, or

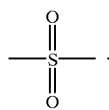

$R^{161}$ represents a hydrogen atom, a monovalent organic group, or a group represented by

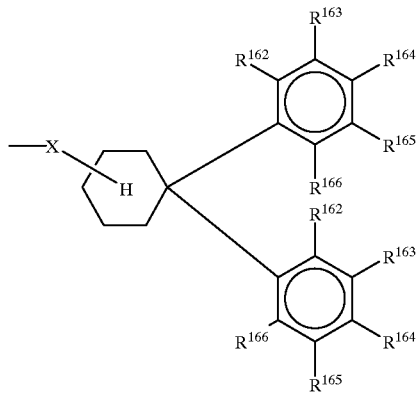

where $R^{162}$ to $R^{166}$ may be the same or different and each represents a hydrogen atom, a hydroxyl group, a halogen atom, an alkyl group, an alkoxy group, an alkenyl group, or the group represented by formula (Ia), provided that at least two of $R^{162}$ to $R^{166}$ are the group represented by formula (Ia), and that the four or six substituents represented by the same symbol need not be the same, and X represents a divalent organic group; and e2 represents 0 or 1.

(XIV)

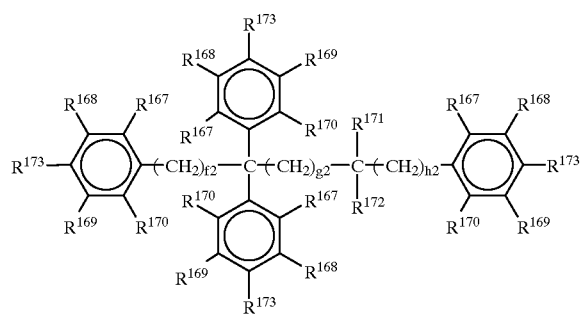

In formula (XIV), $R^{167}$ to $R^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

$R^{171}$ and $R^{172}$ each represents a hydrogen atom, an alkyl group, or a group represented by

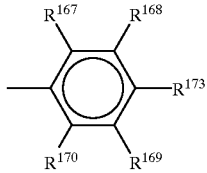

at least two of $R^{173}$'s each represents the group of formula (Ia) and the remainder each represents a hydroxyl group;

f2 and h2 each represents 0 or an integer of 1 to 4; and g2 represents 0 or an integer of 1 to 4.

(XV)

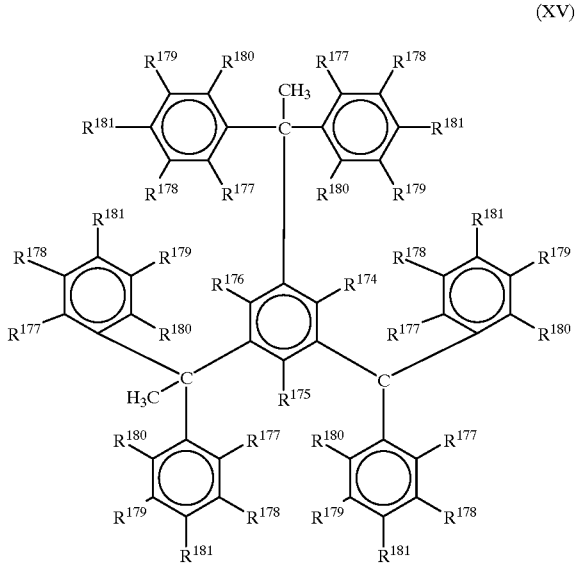

In formula (XV), $R^{174}$ to $R^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and at least two of $R^{181}$'s each represents the group represented by formula (Ia), and the remainder each represents a hydroxyl group.

(XVI)

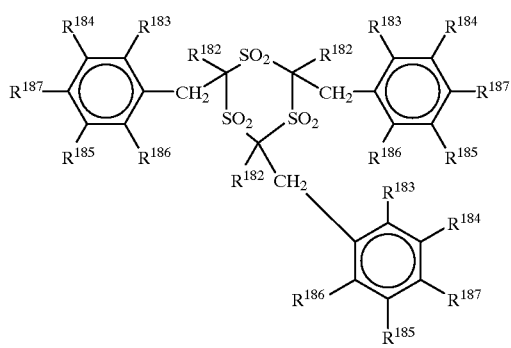

In formula (XVI),

R$^{182}$ represents a hydrogen atom or an alkyl group, provided that the atoms or groups represented by R$^{182}$ need not be the same;

R$^{183}$ to R$^{186}$ each represents a hydroxyl group, a hydrogen atom, a halogen atom, an alkyl group, or an alkoxy group, provided that the three substituents represented by the same symbol need not be the same; and at least two of R$^{187}$'s each represents the group represented by formula (Ia), and the remainder each represents a hydroxyl group.

Specific examples of the frameworks of preferred compounds are shown below.

(1)
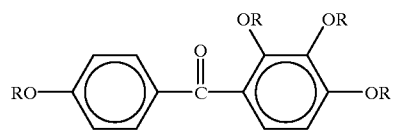

(2)
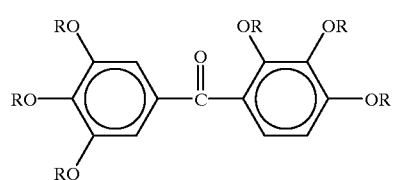

(3)
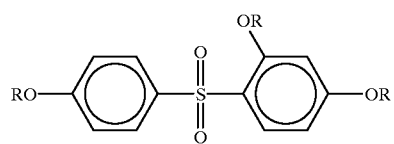

(4)
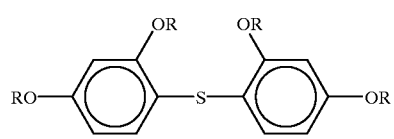

(5)
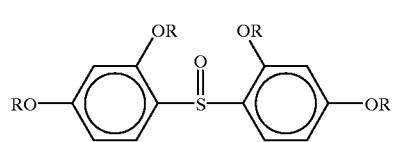

(6)
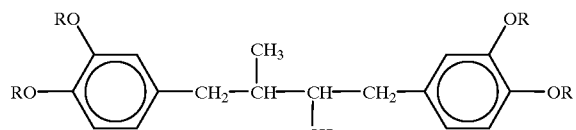

(7)

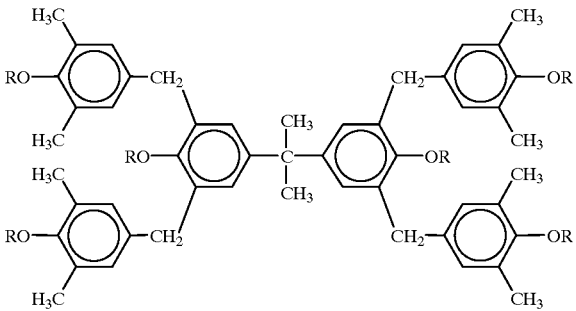

(8)
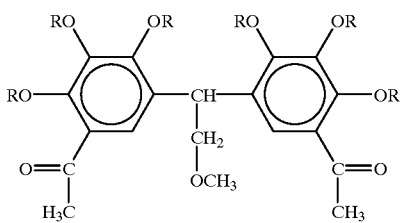

(9)
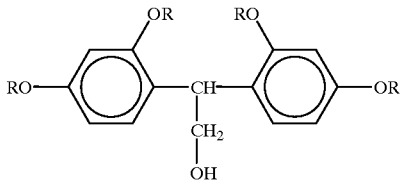

(10)
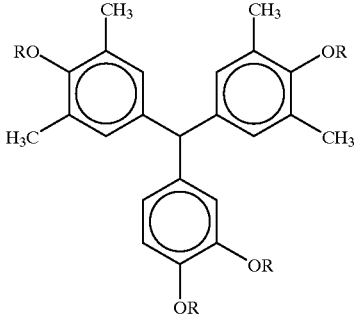

(11)
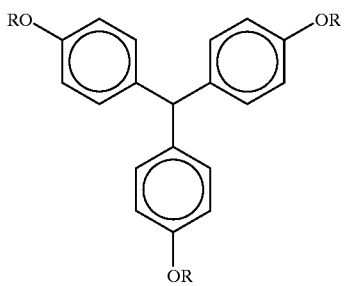

(12)
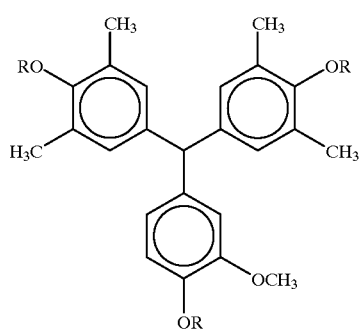
(13)
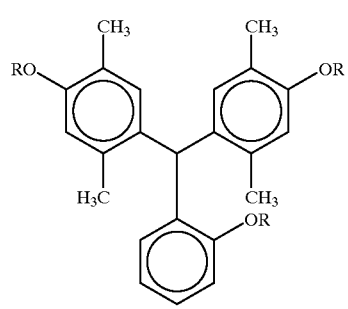
(14)
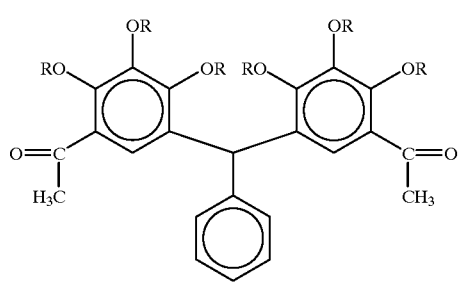
(15)
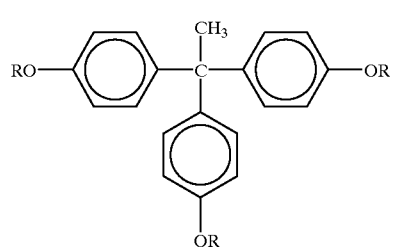
(16)
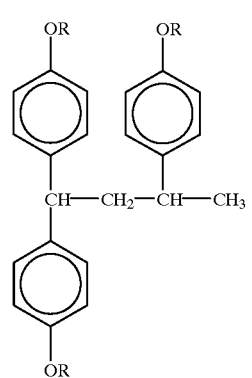
(17)
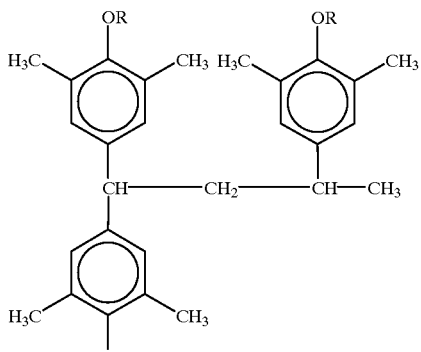
(18)
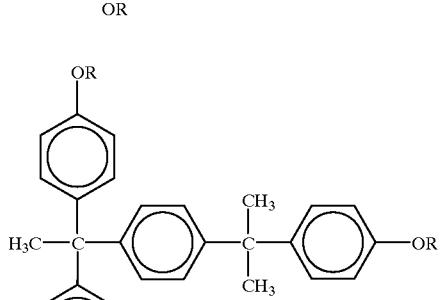
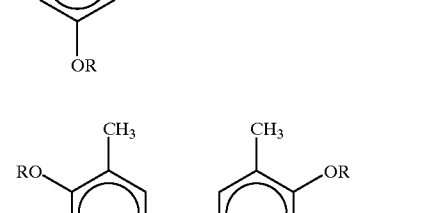
(19)
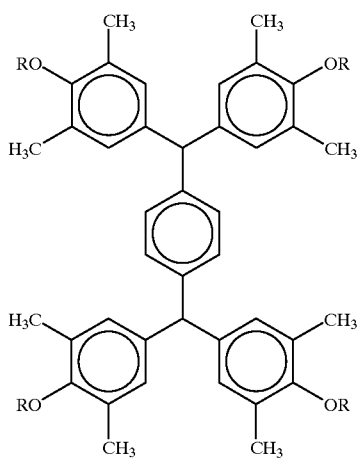

(20) 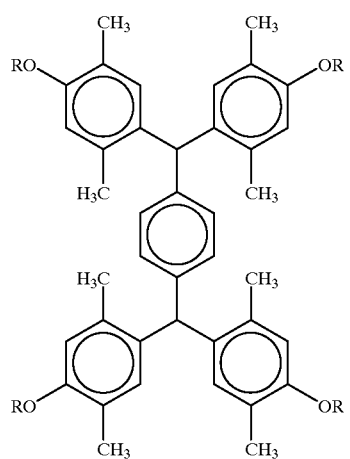
(21) 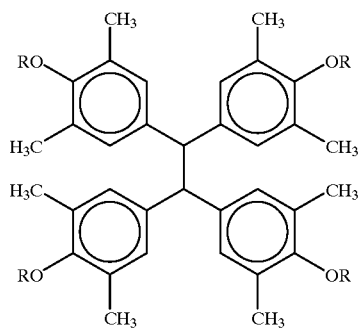
(22) 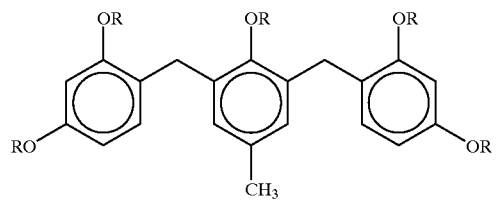
(23) 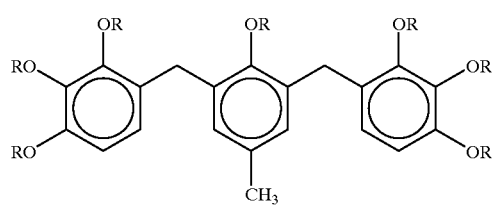
(24) 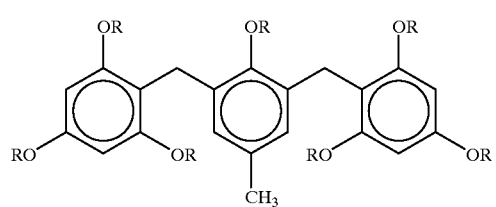
(25) 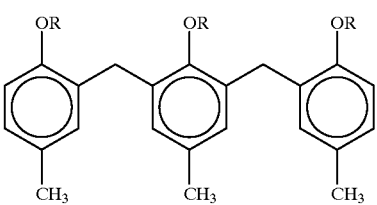
(26) 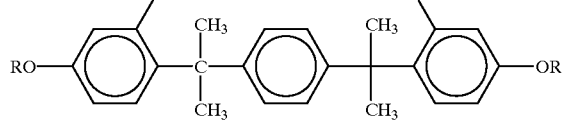
(27) 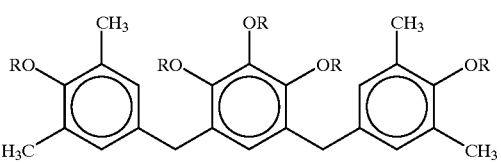
(28) 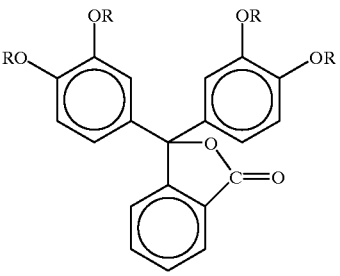
(29) 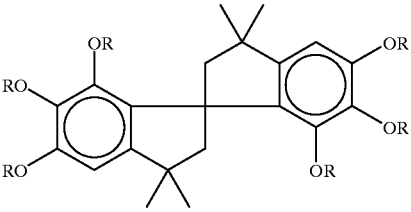
(30) 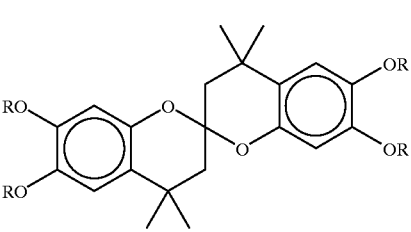

(31)
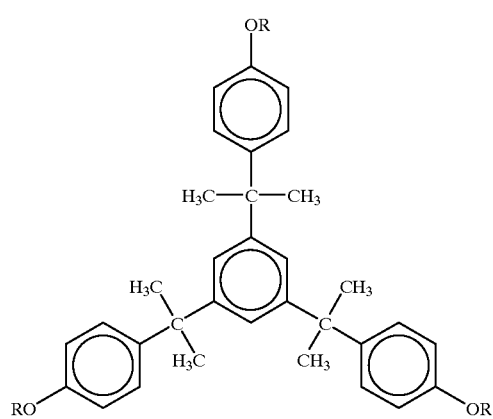
(32)
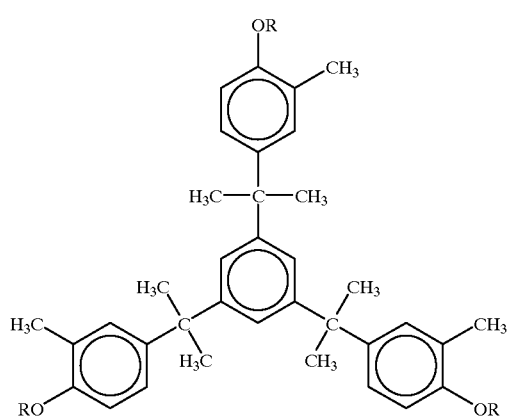
(33)
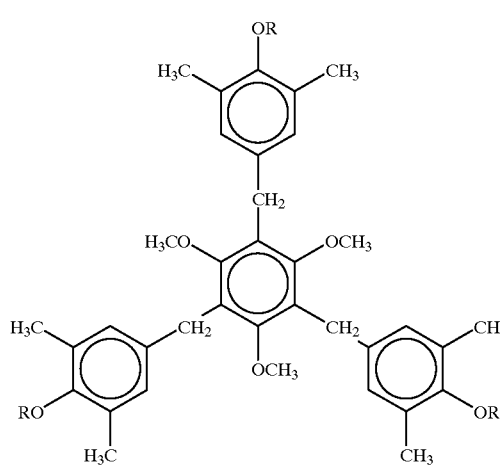
(34)
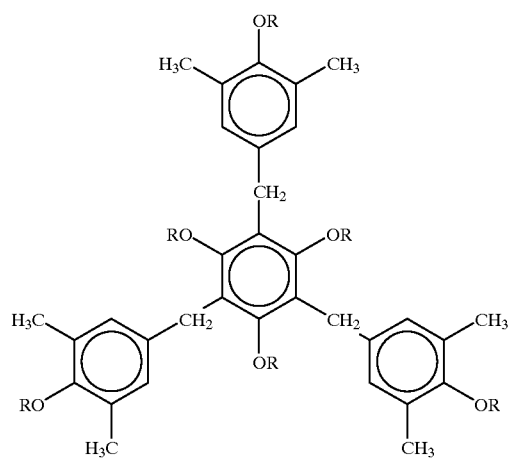
(35)
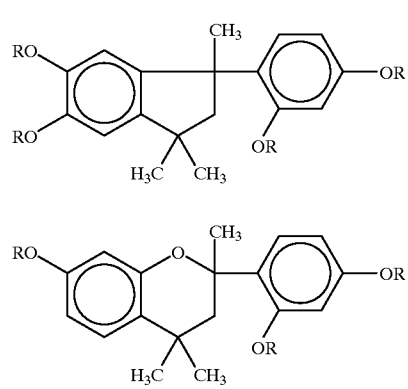
(36)
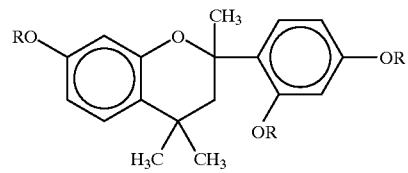
(37)
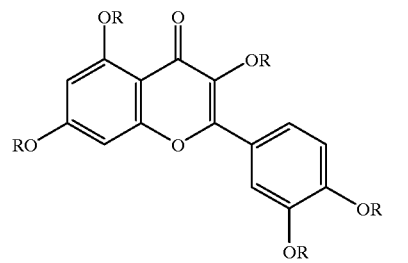
(38)
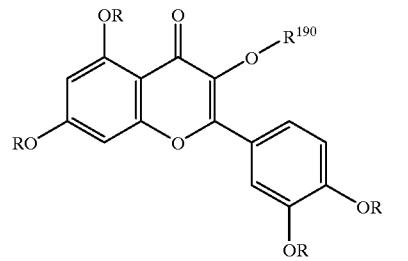
$R^{190}$:
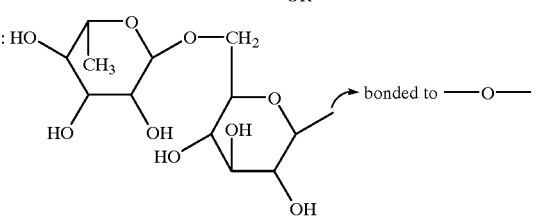

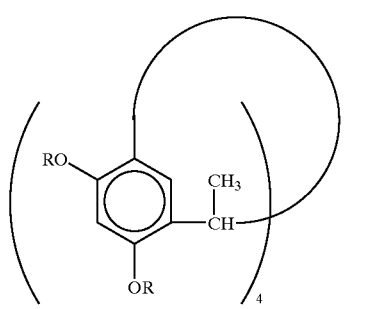
(39)
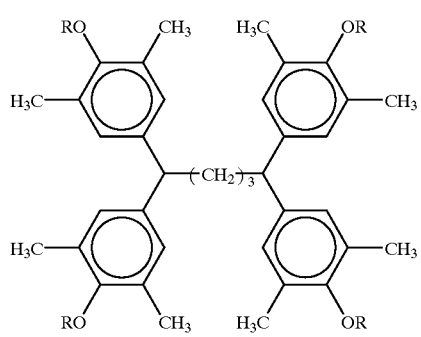
(40)
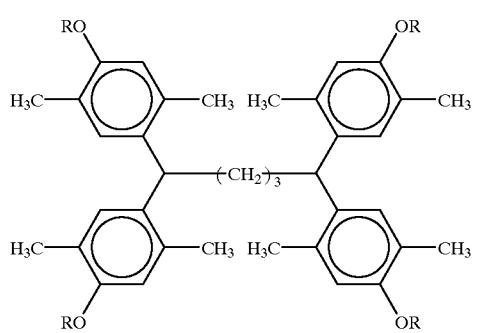
(41)
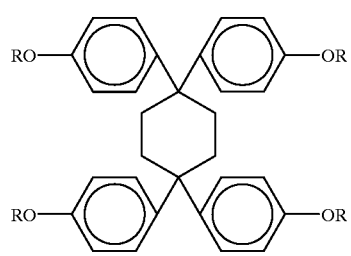
(42)
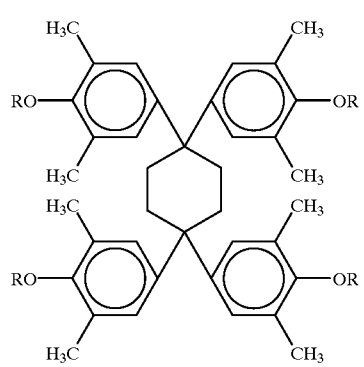
(43)
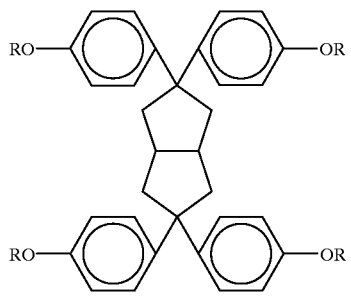
(44)
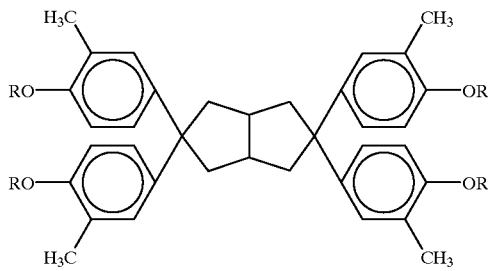
(45)
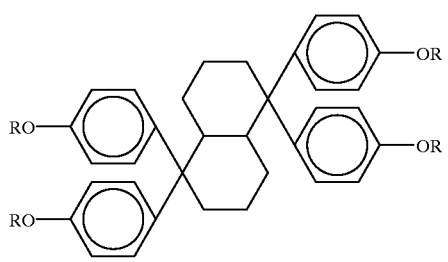
(46)
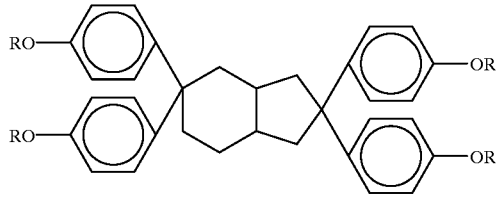
(47)
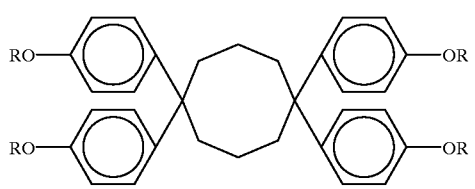
(48)

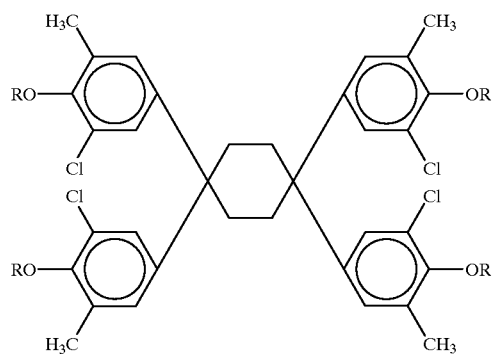
(49)
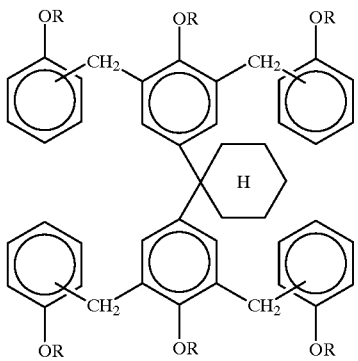
(53)
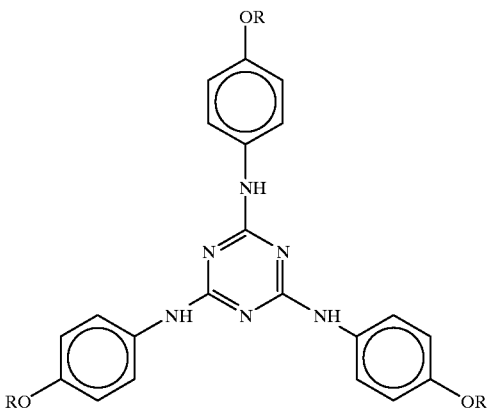
(50)
(54)
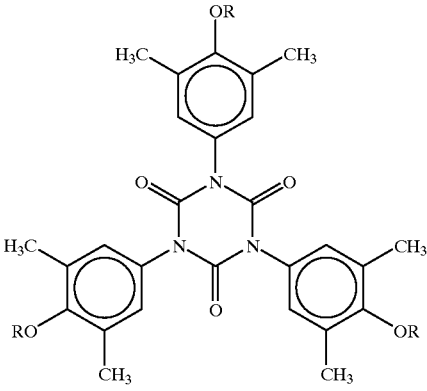
(51)
(55)
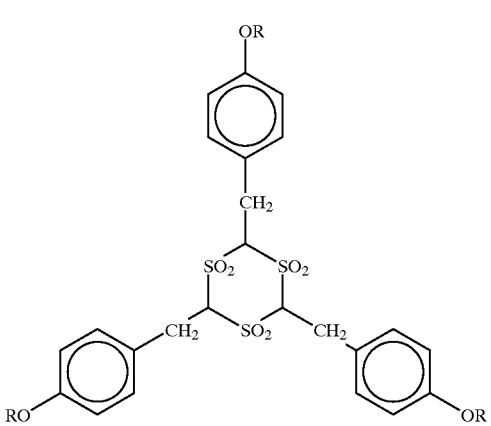
(52)
(56)

(57)
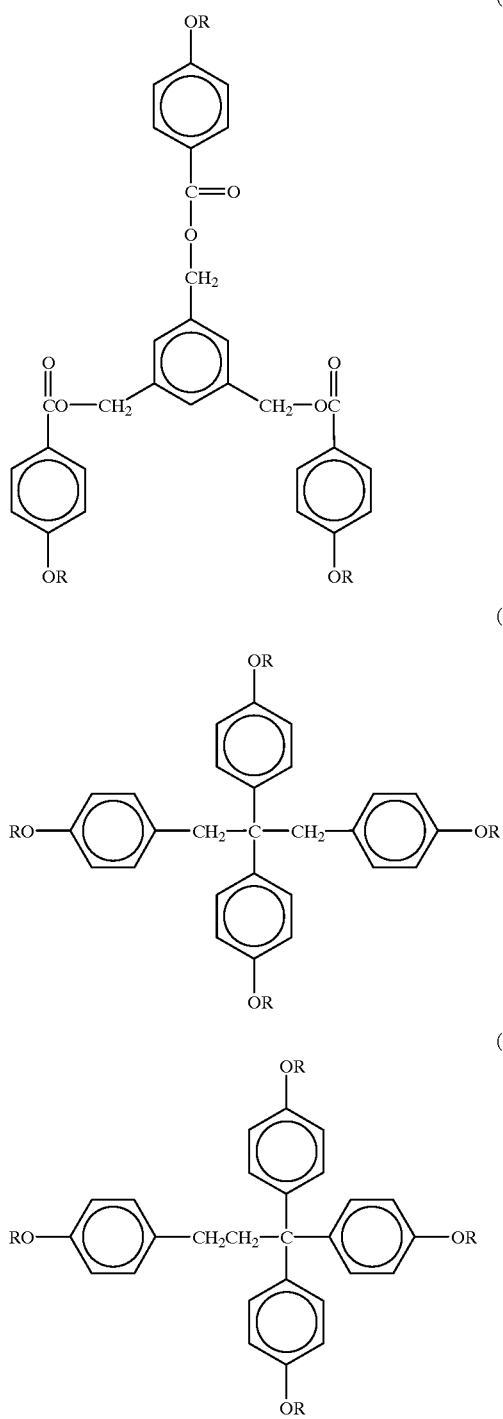
(58)
(59)
(60)
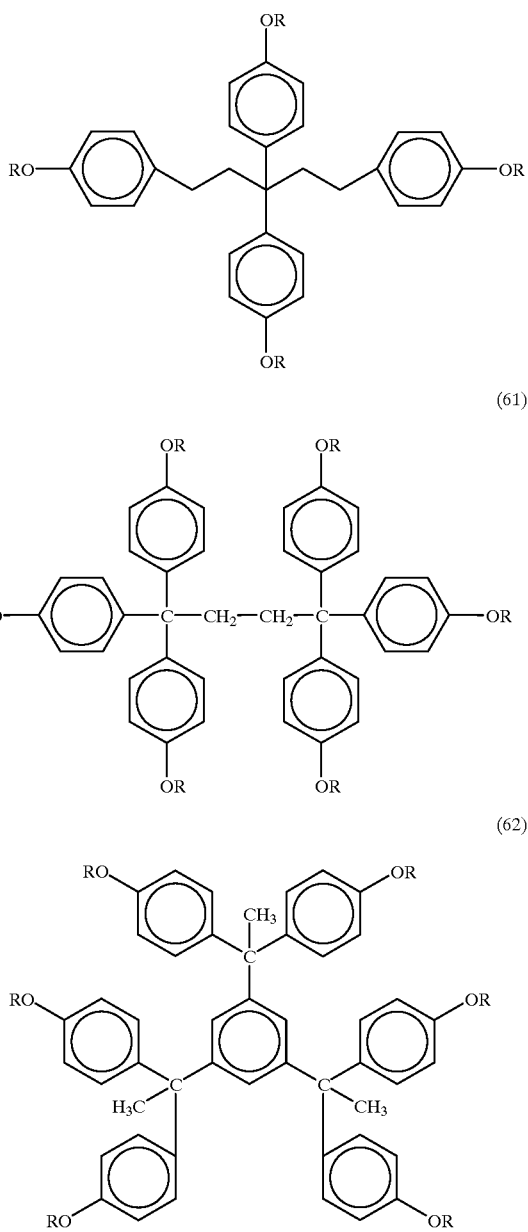
(61)
(62)

(63)

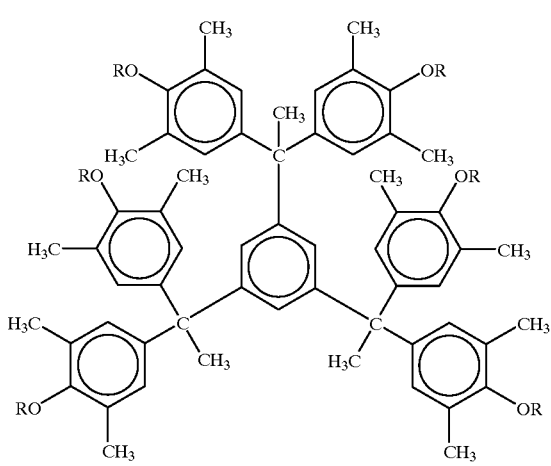

With respect to Compounds (1) to (63) having the group of formula (Ia) according to the present invention, R's each represents a hydrogen atom or any of the following groups.

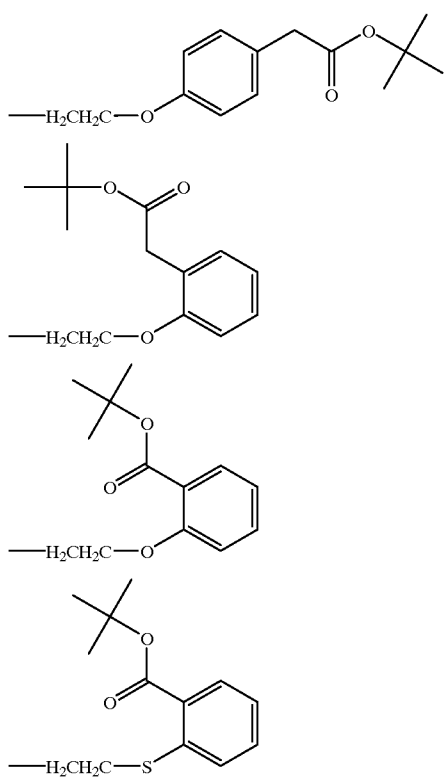

However, at least two or three, according to the structure, of the R's are not hydrogen atoms, and these substituents R's need not be the same.

When Compounds (1) to (63) are those used in combination with the resin having the group represented by formula (Ib), R's may represent a hydrogen atom or any of the following groups.

$-CH_2\text{-}COO\text{-}C(CH_3)_2C_6H_5$ , $-CH_2\text{-}COO\text{-}C_4H_9{}^t$ , $-COO\text{-}C_4H_9{}^t$ ,

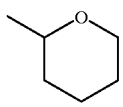

In this case, $R^{101}$, $R^{102}$, $R^{108}$, $R^{130}$, $R^{142}$, $R^{162}$ to $R^{166}$, $R^{173}$, $R^{181}$ and $R^{187}$ may be $-O-R^0-COO-C(R^{01})(R^{02})(R^{03})$ or $-O-CO-O-C(R^{01})(R^{02})(R^{03})$ wherein $R^0$, $R^{01}$, $R^{02}$, and $R^{03}$ have the same meanings as defined hereinabove.

Specific examples of the structural formula of the polymer type dissolution inhibitive compound resin containing a group represented by the general formula (Ib) will be given, but the present invention should not be construed as being limited thereto.

A-1b

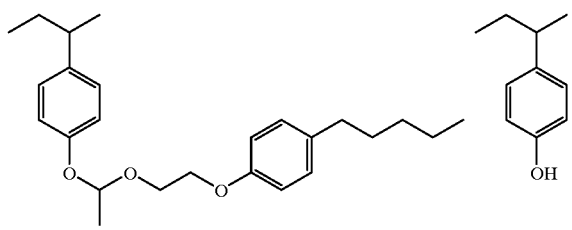

A-2b

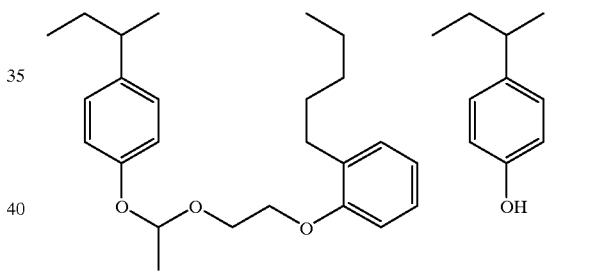

A-3b

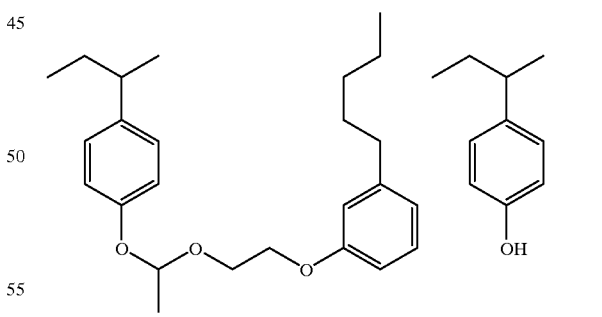

A-4b

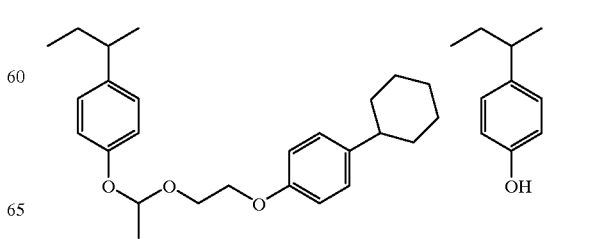

A-5b
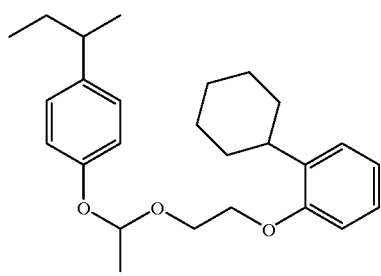 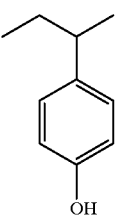
A-10b
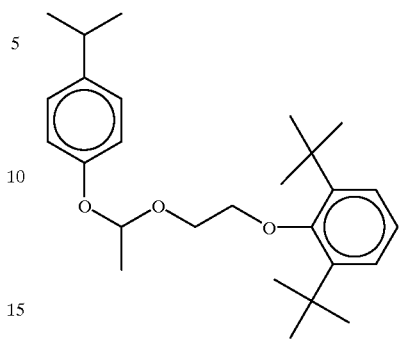 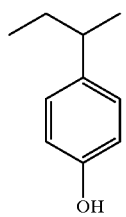
A-6b
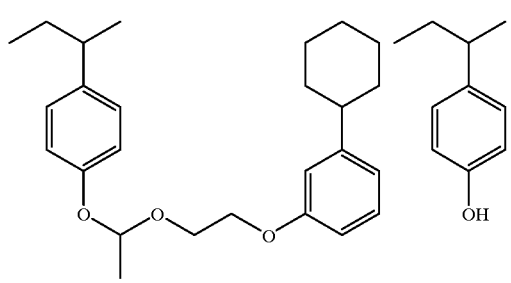
A-11b
A-7b
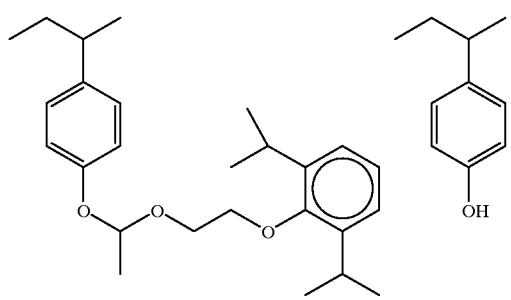
A-12b
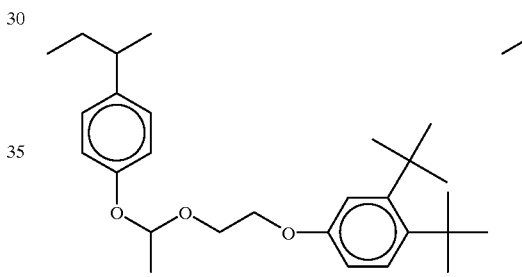
A-8b
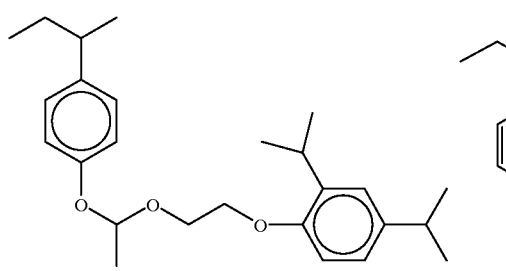
A-13b
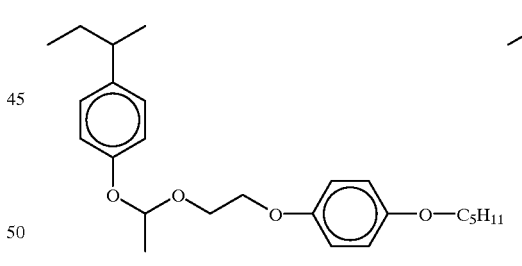
A-9b
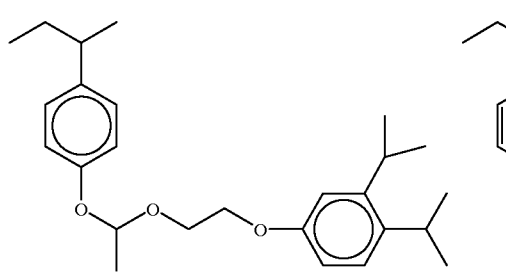
A-14b
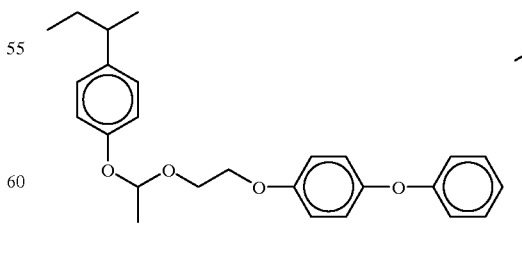

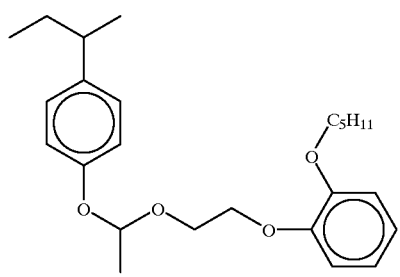 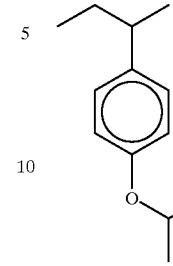 A-15b 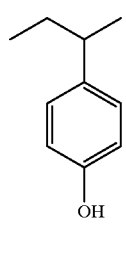
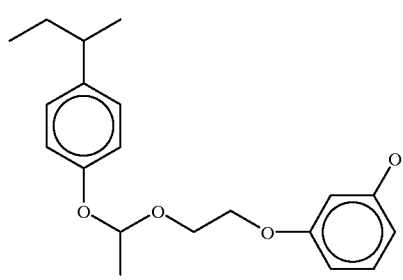 A-16b 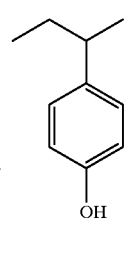
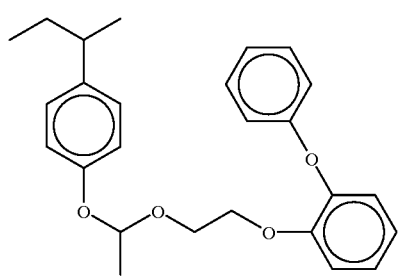 A-17b 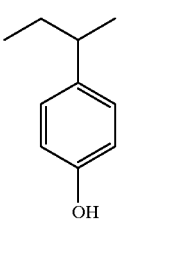
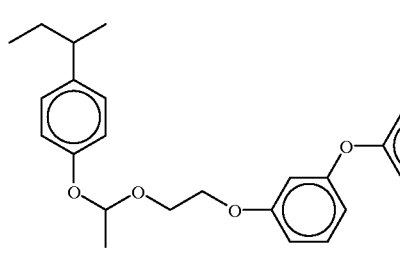 A-18b 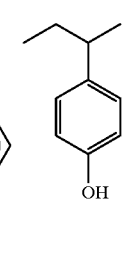
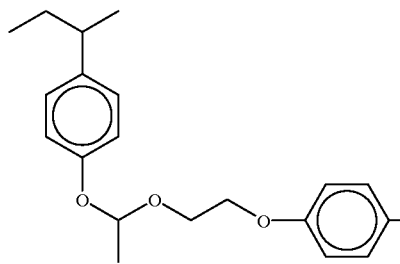 A-19b 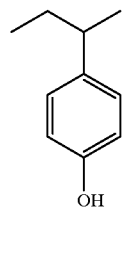
Ad: Adamantyl
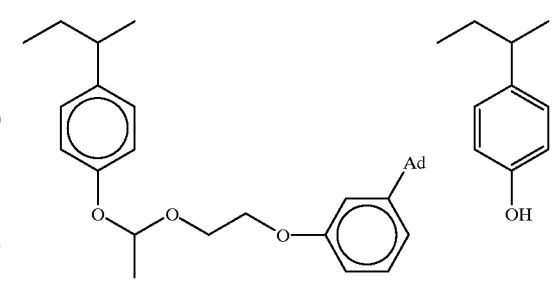 A-20b
A-21b
Ad: Adamantyl
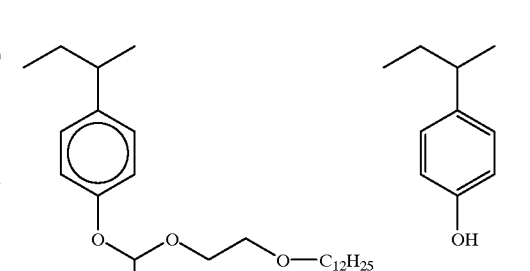 A-22b
A-23b
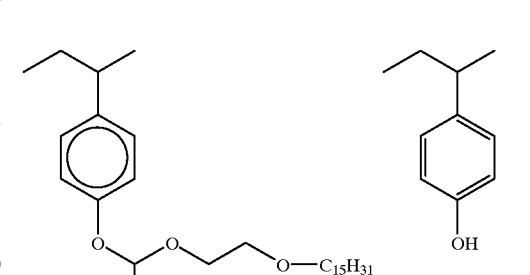 A-24b
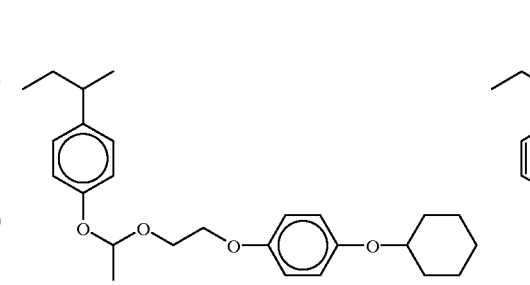

A-25b

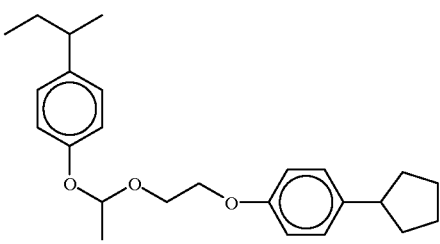 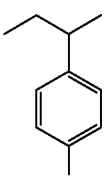

A-26b

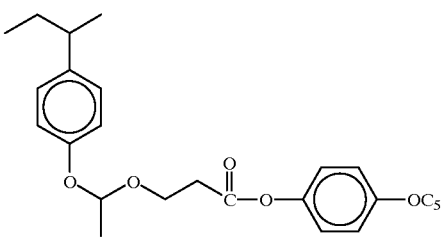 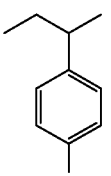

A-27b

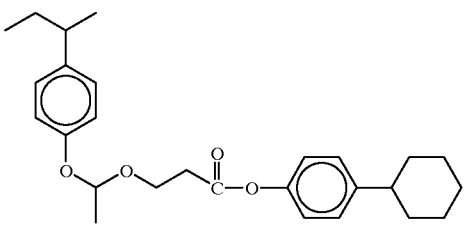 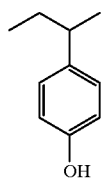

A-28b

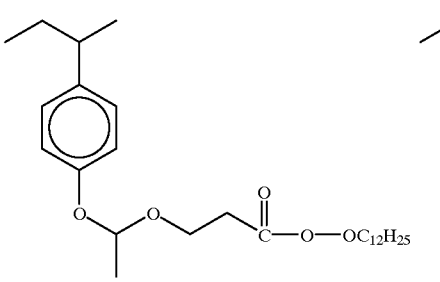 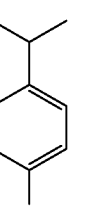

The content of the compound or resin having a group represented by the general formula (Ia) or (Ib) will be given below.

(1) The content of the polymer type dissolution inhibitive compound having a group of formula (Ia) or (Ib) in the composition comprising a photo-acid generator and a polymer type dissolution inhibitive compound is preferably from 5 to 40% by weight, more preferably from 10 to 30% by weight based on the total weight of the composition as calculated in terms of solid content.

(2) The content of the non-polymer type dissolution inhibitive compound having a group of formula (Ia) in the composition comprising a photo-acid generator, a non-polymer type dissolution inhibitive compound and an alkali-soluble resin is preferably from 3 to 50% by weight, more preferably from 5 to 35% by weight based on the total weight of the composition as calculated in terms of solid content.

(3) The content of the non-polymer type dissolution inhibitive compound having a group of formula (Ia) and the polymer type dissolution inhibitive compound having a group of formula (Ia) or (Ib) in the composition comprising a photo-acid generator, a polymer type dissolution inhibitive compound and a non-polymer type dissolution inhibitive compound is preferably from 3 to 40% by weight, more preferably from 5 to 30% by weight, and preferably from 2 to 40% by weight, more preferably from 5 to 30% by weight, respectively, based on the total weight of the composition as calculated in terms of solid content.

(4) The content of the non-polymer type dissolution inhibitive compound having a group of formula (Ia) and the polymer type dissolution inhibitive compound having a group of formula (Ia) or (Ib) in the composition comprising a photo-acid generator, a polymer type dissolution inhibitive compound, a non-polymer type dissolution inhibitive compound and an alkali-soluble resin is preferably from 3 to 40% by weight, more preferably from 5 to 30% by weight, and preferably from 2 to 40% by weight, more preferably from 5 to 30% by weight, respectively, based on the total weight of the composition as calculated in terms of solid content.

In the present invention, an alkali-soluble resin free of acid-decomposable group can be incorporated in the first and second composition to enhance sensitivity. The foregoing alkali-soluble resin free of acid-decomposable group (hereinafter simply referred to as "alkali-soluble resin") is a resin soluble in an alkali. Preferred examples of such a resin include polyhydroxystyrene, novolak resin and derivatives thereof. Further, copolymer resins having p-hydroxystyrene unit may be used so far as they are soluble in an alkali. Particularly preferred examples of such copolymer resins include poly(p-hydroxystyrene), poly(p/m-hydroxystyrene) copolymer, poly(p/o-hydroxystyrene)copolymer, and poly (p-hydroxystyrene-styrene)copolymer. Moreover, poly (alkyl-substituted hydroxystyrene) resins such as poly(4-hydroxy-3-methylstyrene) resin and poly(4-hydroxy-3, 5-dimethylstyrene) resin and resins obtained by partially alkylating or acetylating the phenolic hydroxyl group in the foregoing resins can be preferably used so far as they are soluble in an alkali.

Further, if the foregoing resins have some of the phenol nuclei (not more than 30 mol % of all the phenol nuclei) hydrogenated, it exhibits an enhanced transparency which is advantageous in sensitivity, resolution and rectangularity of profile.

Examples of the alkali-soluble resin employable herein include novolak resin, hydrogenated novolak resin, acetone-pyrogallol resin, polyhydroxystyrene, alkyl-substituted polyhydroxystyrene, poly(hydroxystyrene-N-substituted maleimide)copolymer, partially O-alkylated or O-acylated polyhydroxystyrene, poly(styrene-maleic anhydride) copolymer, carboxyl group-containing methacrylic resin and derivatives thereof, poly(styrene-hydroxystyrene) copolymer, and hydrogenated polyhydroxystyrene. However, the present invention is not limited to these compounds.

Particularly preferred examples of the alkali-soluble resin employable herein include novolak resin, and alkali-soluble resin having p-hydroxystyrene unit such as poly(alkyl-substituted hydroxystyrene) resin (e.g., poly (p-hydroxystyrene), poly(p/m-hydroxystyrene)copolymer, poly(p/o-hydroxystyrene)copolymer, poly(p-hydroxystyrene-styrene)copolymer, poly(4-hydroxy-3-methylstyrene) resin, poly(4-hydroxy-3, 5-dimethylstyrene) resin), resins obtained by alkylating or acetylating some of the phenolic hydroxyl groups in these resins, partially hydrogenated polyhydroxystyrene resin, polyhydroxystyrene resin, partially hydrogenated novolak resin, and partially hydrogenated polyhydroxystyrene resin.

The term "polyhydroxystyrene" as used herein is meant to indicate a polymer obtained by the polymerization of at least one monomer selected from the group consisting of p-hydroxystyrene monomer, m-hydroxystyrene monomer, o-hydroxystyrene monomer and hydroxystyrene monomer obtained by substituting these monomers by a $C_{1-4}$ alkyl group at the position ortho to the position at which hydroxyl group is connected.

The foregoing novolak resin can be obtained by the addition condensation of a predetermined monomer as a main component with aldehydes in the presence of an acidic catalyst.

Examples of the predetermined monomer employable herein include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol, p-t-butylphenol, p-octyphenol and 2,3,5-trimethylphenol, alkoxyphenols such as p-methoxyphenol, m-methoxyphenol, 3, 5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as dihydroxybiphenyl, bisphenol A, phenylphenol, resorcinol and naphthol. These monomers may be used singly or in admixture. However, the present invention is not limited to these monomers.

Examples of the aldehydes employable herein include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and acetalation products thereof. Particularly preferred among these aldehydes is formaldehyde.

These aldehydes may be used singly or in combination. As the acidic catalyst there may be used sulfuric acid, formic acid, acetic acid, oxalic acid or the like.

The content of the alkali-soluble resin free of acid-decomposable group is not more than 50% by weight, preferably not more than 30% by weight, more preferably not more than 20% by weight, based on the sum of the weight of the alkali-soluble resin and the acid-decomposable group-containing resin.

The photo-acid generator (b) to be used herein is a compound which generates an acid upon irradiation with actinic rays or a radiation.

Examples of the compound which generates an acid upon irradiation with actinic rays or a radiation include photocationic polymerization initiator, photoradical polymerization initiator, dye photodecolorizer, dye photodiscolorizer, compound to be incorporated in microresist or the like which generates an acid upon irradiation with known rays (ultraviolet rays having a wavelength range of from 200 nm to 400 nm, far ultraviolet rays, particularly g-ray, h-ray, i-ray, KrF exima laser beam), ArF exima laser beam, electron ray, X ray, molecular ray or ion beam, and mixture thereof. These compounds may be properly selected.

Specific examples thereof include onium salts such as: the diazonium salts described in, e.g., S. I. Schlesinger, *Photogr. Sci. Eng.*, 18, 387 (1974) and T. S. Bal et al., *Polymer,* 21, 423 (1980); the ammonium salts described in, e.g., U.S. Pat. Nos. 4,069,055 and 4,069,056, Reissued U.S. Pat. No. 27,992, and Japanese Patent Application No. 3-140,140; the phosphonium salts described in, e.g., D. C. Necker et al., *Macromolecules,* 17, 2468 (1984), C. S. Wen et al., *Teh, Proc. Conf. Rad. Curing ASIA,* p. 478 Tokyo, Oct (1988), and U.S. Pat. Nos. 4,069,055 and 4,069,056; the iodonium salts described in, e.g., J. V. Crivello et al., Macromolecules, 10 (6), 1307 (1977), *Chem. & Eng. News,* Nov. 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.,* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 3,902,114, 233,567, 297,443, and 297,442, U.S. Pat. Nos. 4,933,377, 161,811, 410,201, 339,049, 4,760,013, 4,734, 444, and 2,833,827, and German Patents 2,904,626, 3,604, 580, and 3,604,581; the selenonium salts described in, e.g., J. V. Crivello et al., *Macromolecules,* 10 (6), 1307 (1977) and J. V. Crivello et al., *J. Polymer Sci., Polymer Chem. Ed.,* 17, 1047 (1979); and the arsonium salts described in, e.g., C. S. Wen et al., *Teh, Proc. Conf. Rad. Curing ASIA,* p. 478 Tokyo, Oct. (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896), and JP-A-2-161445; the photo-acid generators having an o-nitrobenzyl type protective group described in, e.g., S. Hayase et al., *J. Polymer Sci.,* 25, 753 (1987), E. Reichmanis et al., *J. Polymer Sci., Polymer Chem. Ed.,* 23, 1 (1985), Q. Q. Zhu et al., *J. Photochem.,* 36,85,39,317 (1987), B. Amitetal., *Tetrahedron Lett.,* (24) 2205 (1973), D. H. R. Barton et al., *J. Chem Soc.,* 3571 (1965), P. M. Collins et al., *J. Chem. Soc., Perkin I,* 1695 (1975), M. Rudinstein etal., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc. Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al., *Macromolecules,* 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints,* Japan, 35 (8), G. Berner et al., *J. Rad. Curing,* 13 (4), W. J. Mijs et al., *Coating Technol.,* 55 (697), 45 (1983), Akzo, H. Adachi et al., *Polymer Preprints,* Japan, 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.,* 104, 5586 (1982), S. P. Pappas et al., *J. Imaging Sci.,* 30 (5), 218 (1986), S. Kondo et al., *Makromol. Chem., Rapid Commun.,* 9,625 (1988), Y. Yamada et al., *Makromol. Chem.,* 152, 153, 163 (1972), J. V. Crivello et al., *J. Polymer Sci., Polymer Chem. Ed.,* 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis,* (1), 1 (1980), A. Abad et al., *Tetrahedron Lett.,* (47) 4555 (1971), D. H. R. Barton et al., *J. Chem. Soc.,* (C), 329 (1970), U.S. Pat. No. 3,779,778, and European Patent 126,712.

Of the optionally usable compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

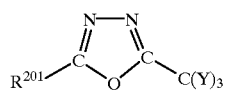
(PAG1)

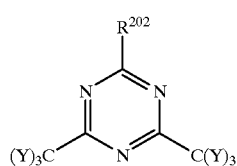
(PAG2)

In the above formulae, $R^{201}$ represents a substituted or unsubstituted aryl or alkenyl group; $R^{202}$ represents a substituted or unsubstituted aryl, alkenyl, or alkyl group or $-C(Y)_3$; and Y represents a chlorine or bromine atom.

Specific examples thereof are given below, but the compounds represented by general formula (PAG1) or (PAG2) should not be construed as being limited thereto.

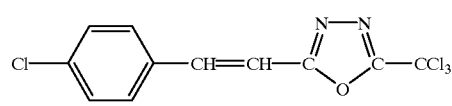
(PAG1-1)

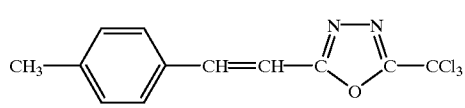
(PAG1-2)

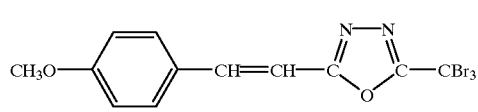
(PAG1-3)

-continued

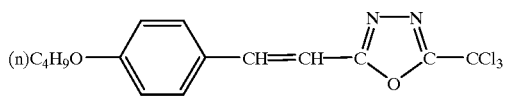
(PAG1-4)

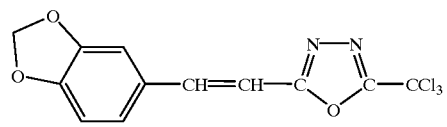
(PAG1-5)

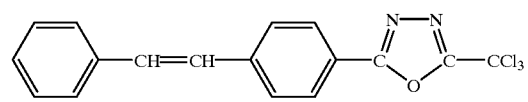
(PAG1-6)

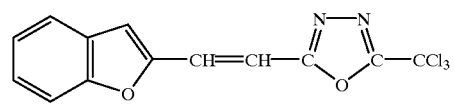
(PAG1-7)

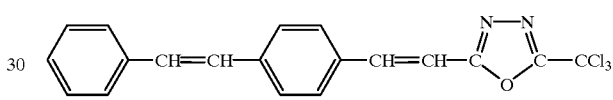
(PAG1-8)

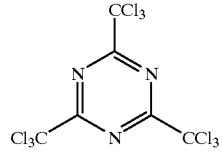
(PAG2-1)

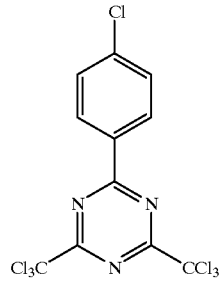
(PAG2-2)

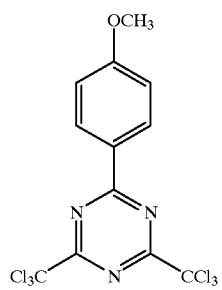
(PAG2-3)

(PAG2-4) 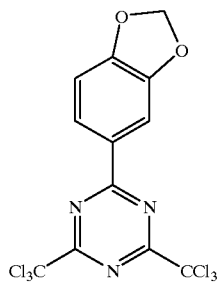

(PAG2-5) 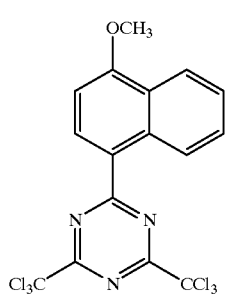

(PAG2-6) 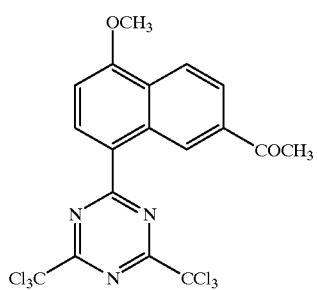

(PAG2-7) 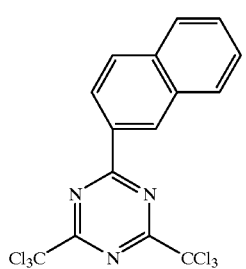

(PAG2-8) 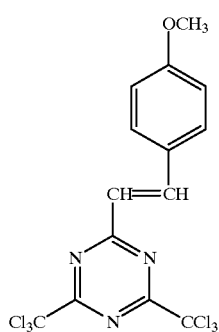

(PAG2-9) 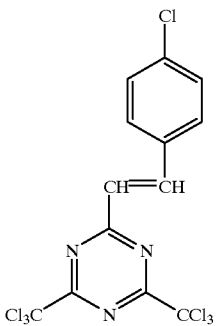

(PAG2-10) 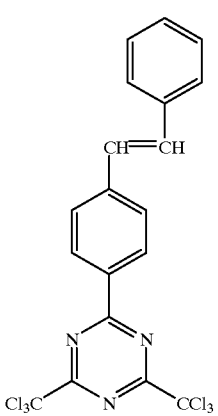

(2) Iodonium salts represented by the following general formula (PAG3) and sulfonium salts represented by the following general formula (PAG4)

(PAG3) 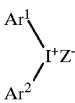

(PAG4) 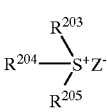

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion and examples thereof include $BF_4^-$, $AsF_6^-$, $PF_6^-$, $SbF_6^-$, $SiF_6^{2-}$, $ClO_4^-$, perfluoro alkane sulfonic acid anions e.g., CF₃SO₃⁻, pentafuluoro benzene sulfonic acid anion, condensation high-valence aromatic sulfonic acid anions, e.g., naphthalene-1-sulfonic acid anion, anthraquinone surfonic acid anion, and a dye having a sufonic acid group. However, the compounds should not be construed as being limited thereto.

Two of $R^{203}$, $R^{204}$, and $R^{205}$ may be bonded to each other through a single bond or substituent thereof. $Ar^1$ and $Ar^2$ may be bonded to each other likewise.

Further, a photo-acid generator which exhibits little change of properties (T-Top formation, line width change, etc.) with time until heat treatment after exposure is desirable. As such a photo-acid generator there may be used a compound represented by the foregoing general formula (PAG3) or (PAG4) wherein $Ar_1$, $Ar_2$ and $R^{203}$ to $R^{205}$ each represent a substituted or unsubstituted aryl group, and $Z^-$ shows a relatively small dispersibility in the resist layer when it is generated as an acid upon irradiation with light. In some detail, $Z^-$ represents a benzenesulfonic, naphthalenesulfonic or anthracenesulfonic anion having at least one group selected from the group consisting of branched or cyclic alkyl or alkoxy groups each having 8 or more carbon atoms, at least two groups selected from the group consisting of $C_{4-7}$ straight-chain, branched or cyclic alkyl or alkoxy groups or at least three groups selected from the group consisting of $C_{1-3}$ straight-chain or branched alkyl or alkoxy groups.

Specific examples thereof are given below, but the compounds represented by general formula (PAG3) or (PAG4) should not be construed as being limited thereto.

(PAG3-1)

(PAG3-2)

(PAG3-3)

(PAG3-4)

(PAG3-5)

(PAG3-6)
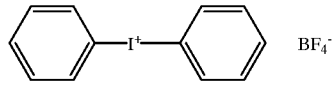
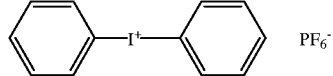
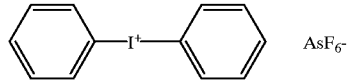
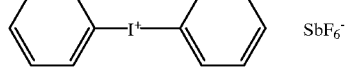
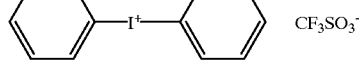
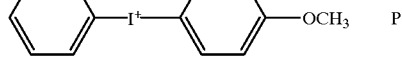

(PAG3-7)
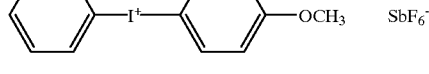

-continued (PAG3-8)
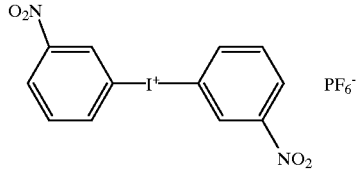

(PAG3-9)

(PAG3-10)
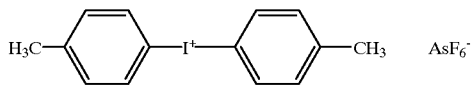

(PAG3-11)
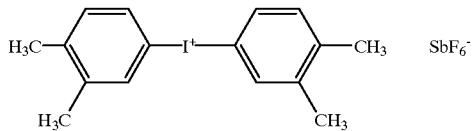

(PAG3-12)
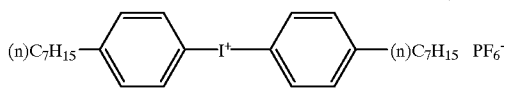

(PAG3-13)
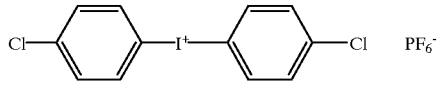

(PAG3-14)
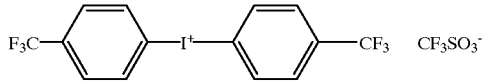

(PAG3-15)
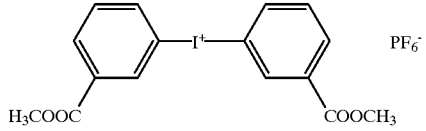

(PAG3-16)
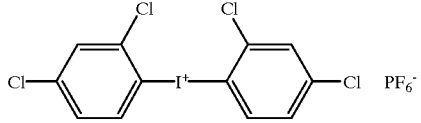

(PAG3-17)
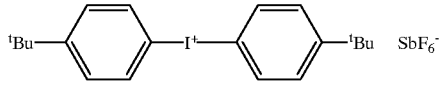

(PAG3-18)
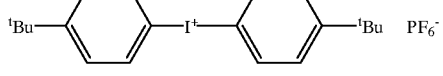

(PAG3-19)
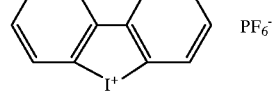

(PAG3-20)
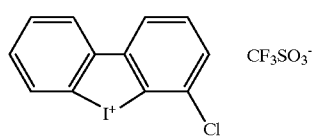
(PAG3-21)
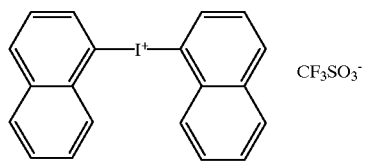
(PAG3-22)
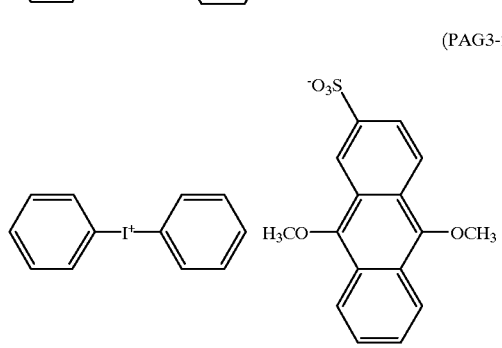
(PAG3-23)
(PAG3-24)
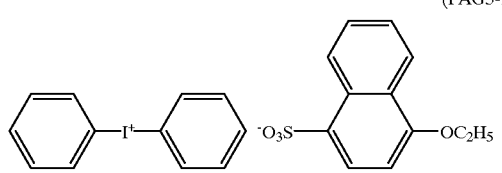
(PAG3-25)
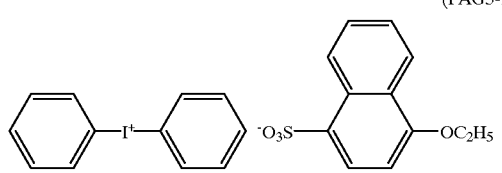
(PAG3-26)
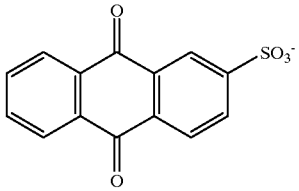
(PAG3-27)
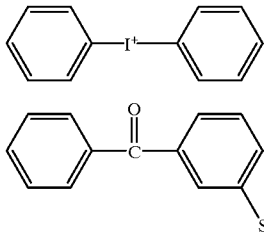
(PAG3-28)
(PAG3-29)
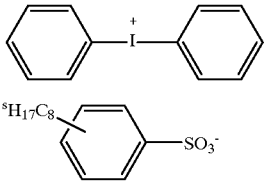
(PAG3-30)
(PAG3-31)
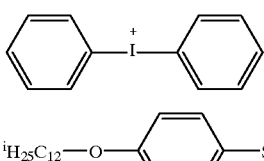
(PAG3-32)

-continued
(PAG3-33)
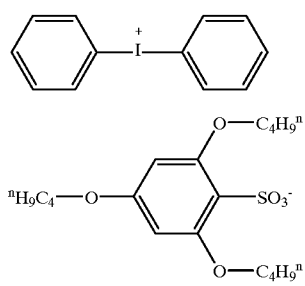
(PAG3-34)
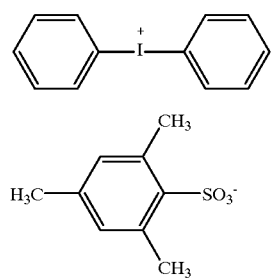
(PAG3-35)
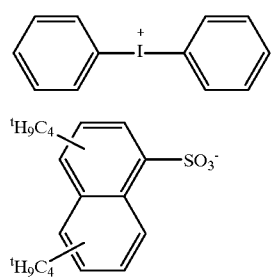
(PAG3-36)
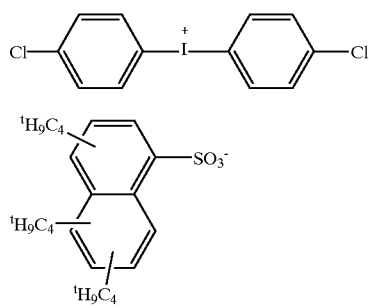
(PAG3-37)
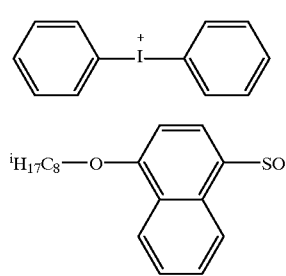
(PAG3-38)
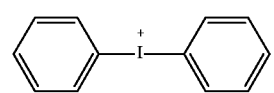
-continued
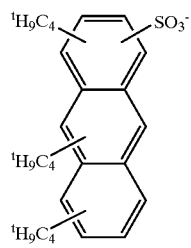
(PAG3-39)
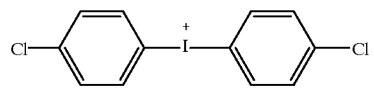
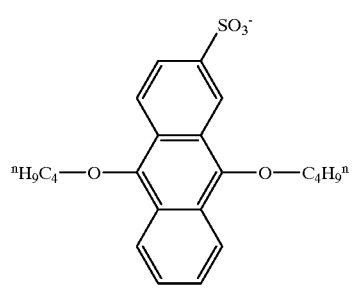
(PAG3-40)
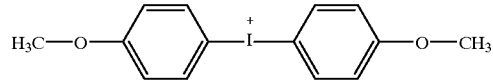
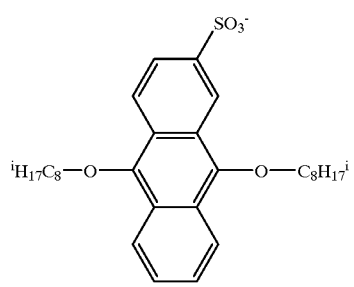
(PAG4-1)
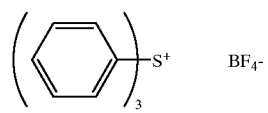
(PAG4-2)
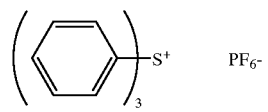
(PAG4-3)
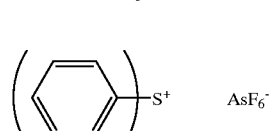
(PAG4-4)
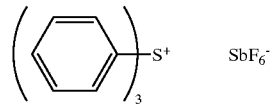

(PAG4-5) 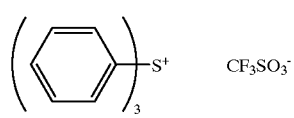
(PAG4-6) 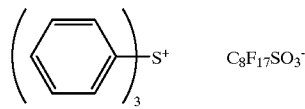
(PAG4-7) 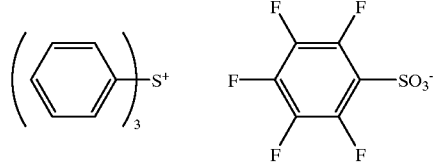
(PAG4-8) 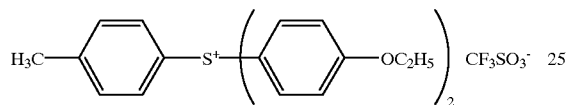
(PAG4-9) 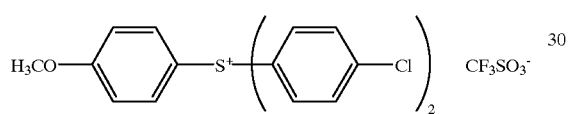
(PAG4-10) 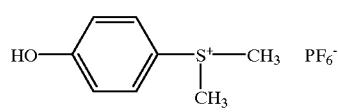
(PAG4-11) 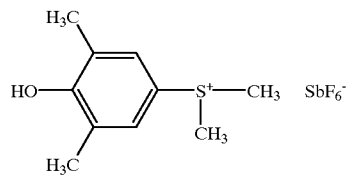
(PAG4-12) 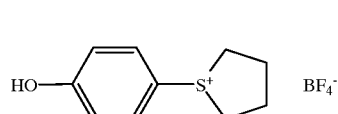
(PAG4-13) 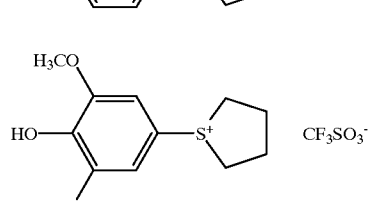
(PAG4-14) 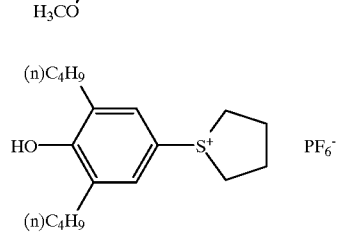
(PAG4-15) 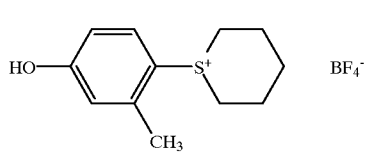
(PAG4-16) 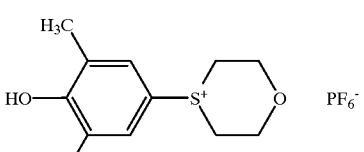
(PAG4-17) 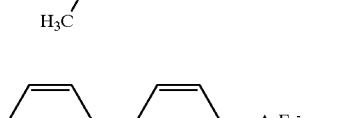
(PAG4-18) 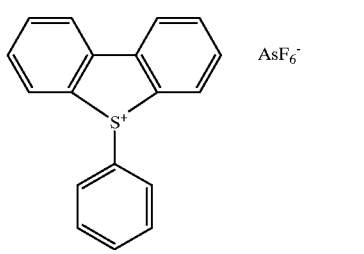
(PAG4-19) 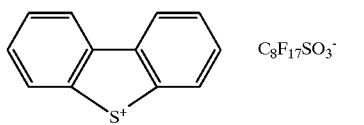
(PAG4-20) 
(PAG4-21) 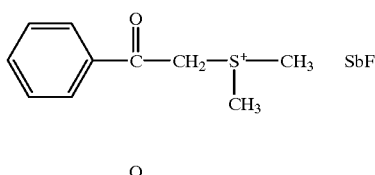
(PAG4-22) 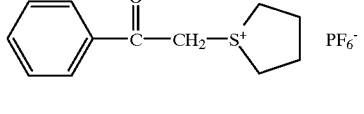
(PAG4-23) 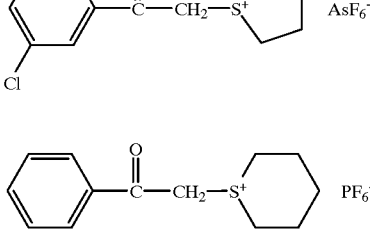

(PAG4-24)
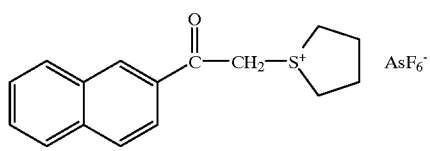
AsF6-
(PAG4-25)
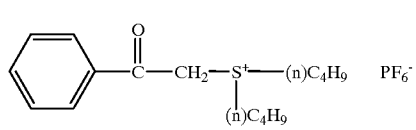
PF6-
(PAG4-26)
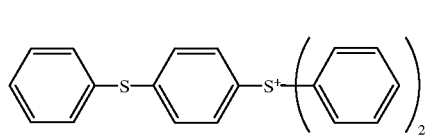
C8H17SO3-
(PAG4-27)
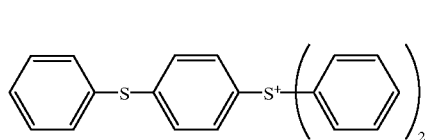
SbF6-
(PAG4-28)
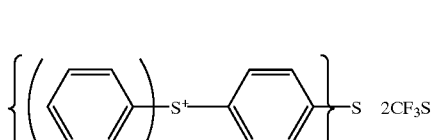
2CF3SO3-
(PAG4-29)
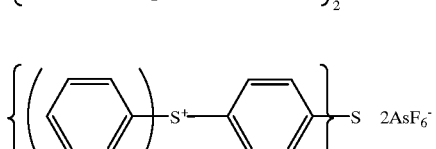
2AsF6-
(PAG4-30)
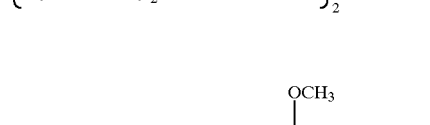
(PAG4-31)
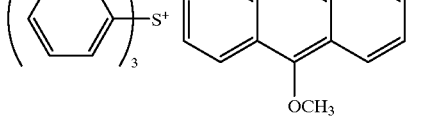
(PAG4-32)
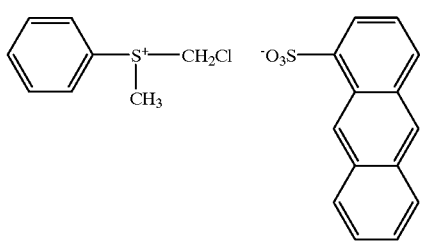
(PAG4-33)
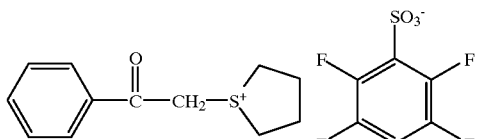
(PAG4-34)
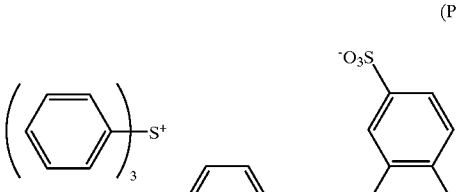
(PAG4-35)
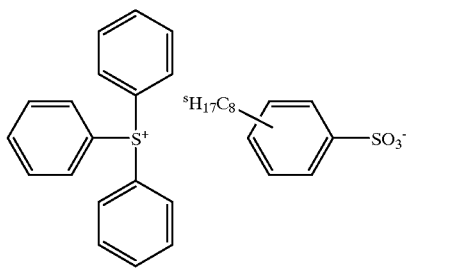
(PAG4-36)
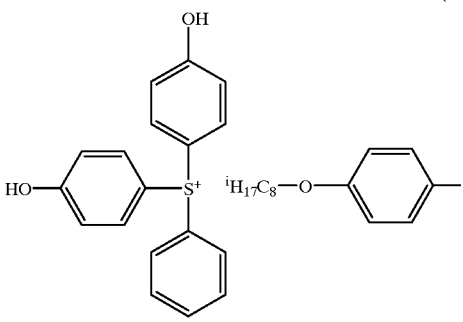

(PAG4-37)
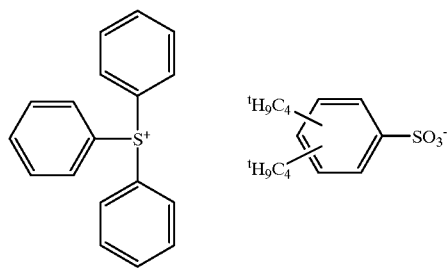
(PAG4-38)
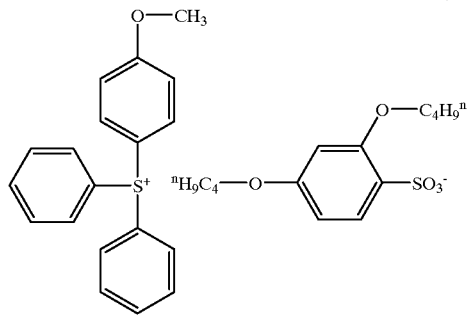
(PAG4-39)
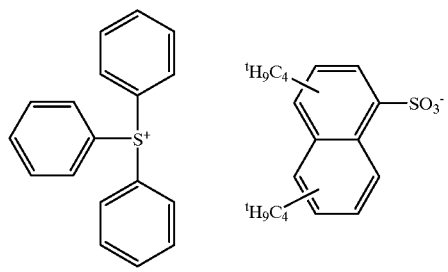
(PAG4-40)
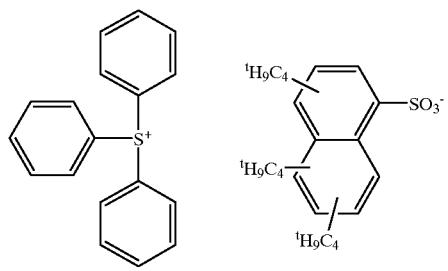
(PAG4-41)
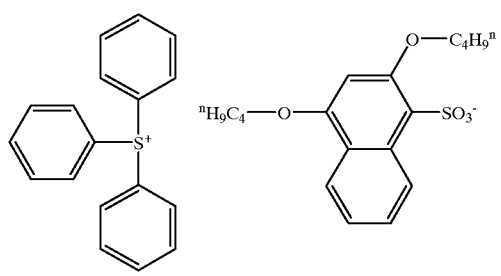
(PAG4-42)
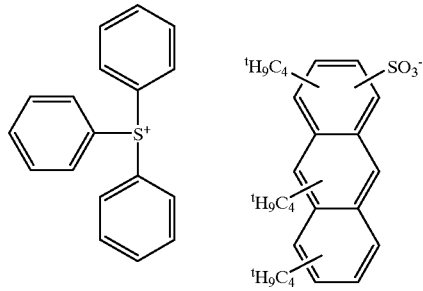
(PAG4-43)
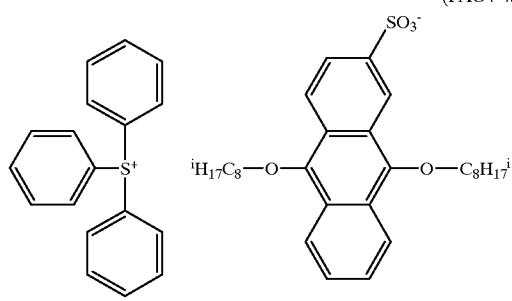
(PAG4-44)
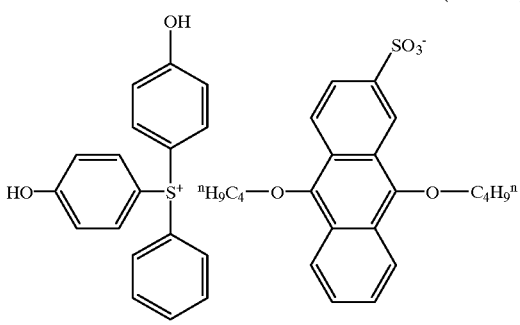
(PAG4-45)
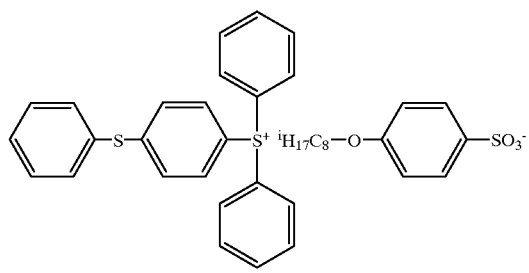
(PAG4-46)
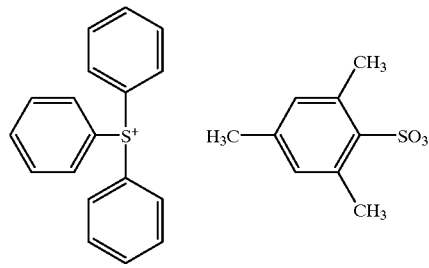

-continued (PAG4-47)

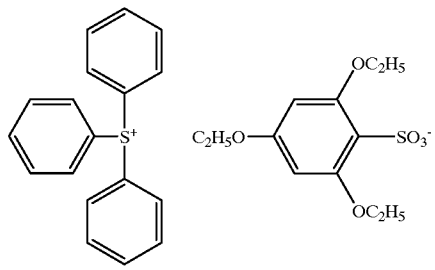

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2535 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

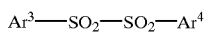

(PAG5)

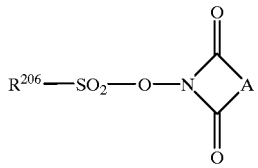

(PAG6)

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

(PAG5-1)

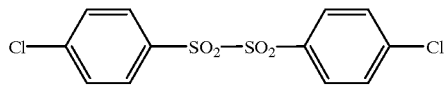

(PAG5-2)

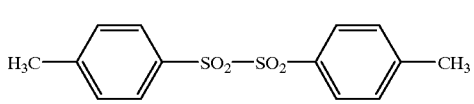

(PAG5-3)

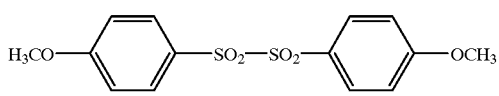

-continued (PAG5-4)

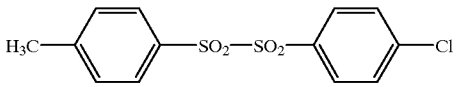

(PAG5-5)

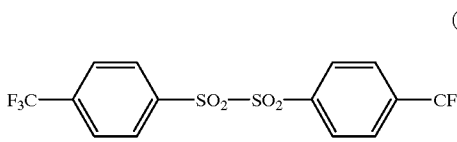

(PAG5-6)

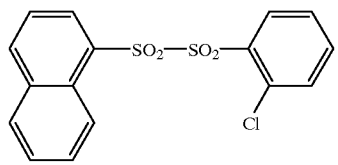

(PAG5-7)

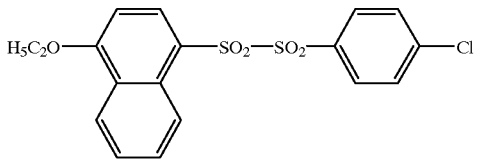

(PAG5-8)

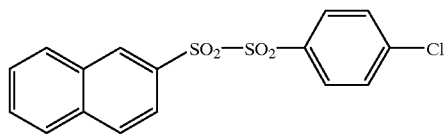

(PAG5-9)

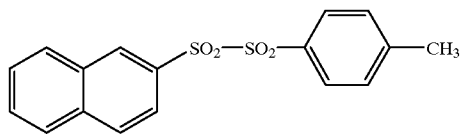

(PAG5-10)

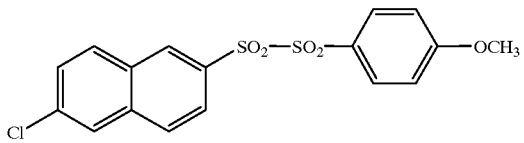

(PAG5-11)

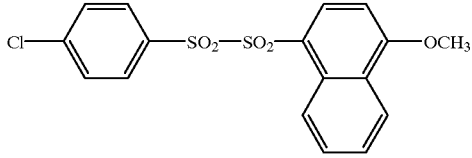

(PAG5-12)

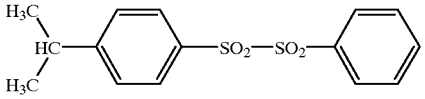

(Chemical structure diagrams of photoacid generators PAG5-13, PAG5-14, PAG6-1 through PAG6-14.)

-continued (PAG6-15)

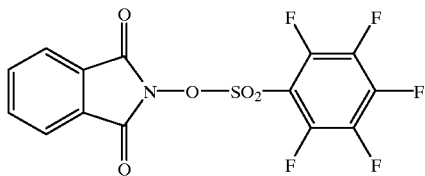

Preferred examples of the compound (b) which generates an acid upon irradiation with actinic rays or a radiation employable herein include onium salt, disulfone, 4-position DNQ sulfonic acid ester, and triazine compound. Two or more of these compounds may be used in admixture. In this case, compounds having similar structures, e.g., onium salts may be mixed. Alternatively, compounds having different skeletons, e.g., onium salt and disulfone may be mixed.

The amount of the compound generating an acid upon irradiation with actinic rays or a radiation is generally from 0.001 to 40% by weight, preferably from 0.01 to 20% by weight, more preferably from 0.1 to 5% by weight, based on the total amount of the photosensitive composition (excluding the solvent). If it is less than 0.001% by weight, the reduced sensitivity is caused, and if it exceeds 40% by weight, light absorption of the resist is extremely increased, thereby undesirably resulting in deteriorated profile and narrow process (especially, bake) margin.

An organic basic compound can be used in the composition of the present invention. Use of this compound is preferred in that it serves to improve storage stability and reduce the change in line width during PED.

Preferred organic basic compounds usable in the present invention are compounds which are more strongly basic than phenol.

Especially preferred among these are nitrogen-containing basic compounds.

Preferred chemical environments include structures represented by the following formulae (A) to (E).

(A)

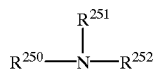

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

(B)

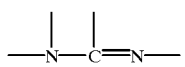

(C)

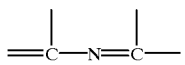

(D)

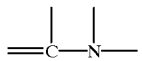

(E)

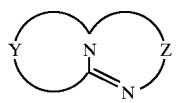

(In formula (E), $R^{253}$, $R^{254}$, $R^{255}$, and $R^{256}$ may be the same or different and each represents an alkyl group having 1 to 6 carbon atoms.)

More preferred organic basic compounds are nitrogen-containing basic compounds having, per molecule, two or more nitrogen atoms having different chemical environment.

It is more preferred that the basic nitrogen-containing compound has a polycyclic structure. Preferred examples of the basic nitrogen-containing compound include those represented by the following formula (F).

(F)

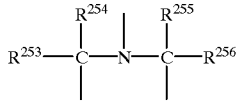

In formula (F), Y and Z may be the same or different and each represent a straight-chain, branched or cyclic alkylene group which may contain a hetero atom or may be substituted. Examples of the hetero atom include a nitrogen atom, a sulfur atom, and an oxygen atom. The alkylene group preferably has from 2 to 10 carbon atoms, more preferably from 2 to 5 carbon atoms. Examples of substituents on the alkylene group include $C_{1-6}$ alkyl, aryl or alkenyl group, halogen atom, and halogen-substituted alkyl group. Examples of the basic nitrogen-containing compound represented by formula (F) include those exemplified below.

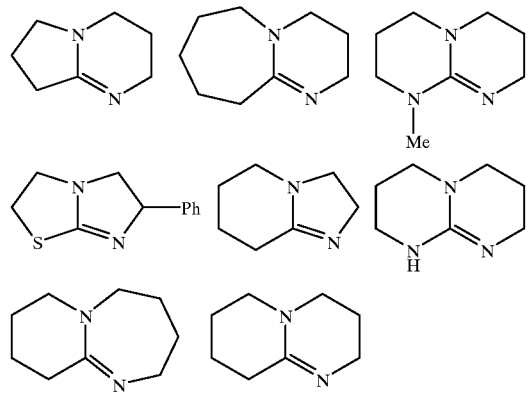

Particularly preferred examples of the compound represented by the general formula (I) are 1,8-diazabicyclo[5.4.0]undeca-7-ene and 1,5-diazabicyclo[4.3.0]nona-5-ene. As the nitrogen-containing basic compounds having, per molecule, two or more nitrogen atoms having different chemical environment, particularly preferred are compounds containing both at least one substituted or unsubstituted amino group and at least one nitrogen-containing ring structure and compounds having at least one alkylamino group. Preferred examples of such compounds include substituted or unsubstituted guanidine, substituted or unsubstituted aminopyridine, substituted or unsubstituted aminoalkylpyridines, substituted or unsubstituted aminopyrrolidine, substituted or unsubstituted imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of the most preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the aforementioned effects cannot be obtained. On the other hand, amounts thereof exceeding 10 parts by weight tend to result in reduced sensitivity and impaired development resistance of unexposed areas.

The chemical amplification type positive resist composition of the present invention may optionally further contain other ingredients such as, e.g., surfactants, dyes, pigments, plasticizers, photosensitizers, and compounds having two or more phenolic OH groups and accelerating dissolution in a developing solution.

Preferred examples of the surfactants include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), Asahi Guard AG710 and Surflon S-382, SC101, SC102, SC103, SC104, SC105, and SC106 (manufactured by Asahi Glass Co., Ltd.); organosiloxane polymerKP341 (manufactured by Shin-Etsu Chemical Co., Ltd., Japan); and acrylic or methacrylic (co)polymers Polyflow No.75 and No.95 (manufactured by Kyoeisha Chemical Co., Ltd.

These surfactants may be added alone or in combination of two or more thereof. The addition amount thereof is preferably from 0.0005 to 0.01 part by weight per 100 parts by weight of the composition (excluding the solvent).

Preferred examples of the dyes include oil-soluble dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd.), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to show absorption in a region of longer wavelengths than far ultraviolet, whereby the chemical amplification type positive resist of the present invention can be rendered sensitive to an i- or g-line. Preferred examples of such spectral sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

Examples of the compounds having two or more phenolic OH groups and accelerating dissolution in a developing solution include polyhydroxy compounds. Preferred examples of the polyhydroxy compounds include phenols, resorcinol, phloroglucinol, phloroglucide, 2,3,4-trihydroxybenzophenone, 2,3,4,4'-tetrahydroxybenzophenone, α, α', α"-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)cyclohexane.

The chemically-sensitized positive photosensitive composition of the present invention is prepared by dissolving the foregoing components in a solvent. The chemically-sensitized positive photosensitive composition thus prepared is then applied to a support. Preferred examples of the solvent employable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N, N-dimethylformamide, dimethyl sulfoxide, N-methyl pyrrolidone, and tetrahydrofuran. These solvents may be used singly or in admixture.

A satisfactory resist pattern can be obtained by applying the chemical amplification type positive resist composition described above on a substrate such as those for use in the production of precision integrated-circuit elements (e.g., silicon/silicon dioxide coating) by an appropriate coating means, e.g., a spinner or coater, exposing the coating to light through a given mask, and then baking and developing the coating.

Examples of the developing solution for the chemically-sensitized positive photosensitive composition of the present invention include aqueous solution of alkalis such as inorganic alkali (e.g., sodium hydroxide, potassium hydroxide, sodium carbonate, sodium silicate, sodium phosphate, sodium metasilicate, ammonia), primary amine (e.g., ethylamine, n-propylamine), secondary amine (e.g., diethylamine, di-n-butylamine), tertiary amine (e.g., triethylamine, methyldiethylamine), alcoholamine (e.g., dimethylethanolamine, triethanolamine), amide (e.g., formamide, acetamide), quaternary ammonium salt (e.g., tetramethylammonium hydroxide, trimethyl(2-hydroxyethyl) ammonium hydroxide, tetraethylammonium hydroxide, tributylammonium hydroxide, tetraethanolammonium hydroxide, methyltriethanolammonium hydroxide, benzylmethyldiethanol ammonium hydroxide, benzyldimethylethanolammonium hydroxide, benzyltriethanolammonium hydroxide, tetrapropylammonium hydroxide, tetrabutylammonium hydroxide), and cyclic amine (e.g., pyrrole, piperidine).

EXAMPLES

The present invention will be further described in the following examples, but the present invention should not be construed as being limited thereto.

SYNTHESIS EXAMPLE I-1a: Synthesis of vinyl ether 76.5 g (0.5 mols) of p-hydroxyphenylacetic acid was dissolved in 500 ml of tetrahydrofuran (THF). The resulting reaction solution was then cooled to a temperature of from −20° C. to −15° C. To the reaction solution was then added dropwise 231 g (1.1 mols) of trifluoroacetic anhydride. After the termination of dropwise addition, the reaction mixture was stirred at room temperature for 12 hours. The reaction solution was then again cooled to a temperature of from −20° C. to −15° C. To the reaction solution was then added dropwise 37 g (0.5 mols) of t-butanol. The reaction mixture was then stirred at room temperature for 3 hours. To the reaction solution was then added dropwise 100 ml of aqueous ammonia. The reaction mixture was then extracted with water to obtain t-butyl p-hydroxyphenylacetate.

52 g of t-butyl p-hydroxyphenylacetate thus obtained was then dissolved in toluene. To the solution was then added 100 ml of chloroethyl vinyl ether. To the mixture was then added sodium hydroxide tetrabutylammonium bromide. The mixture was then stirred at a temperature of 120° C. for 5 hours.

The reaction solution was washed with water, and then concentrated to obtain 2-(4-t-butyloxycarbonylmethyl phenyloxy)ethylvinyl ether (X-1a).

SYNTHESIS EXAMPLES I-2a, I-3a and I-4a

The procedure of Synthesis Example I-1a was followed except that as the starting materials there were used o-hydroxyphenylacetic acid, benzoic acid and thiosalicylic acid, respectively. As a result, 2-(4-t-butyloxycarbonyl methylphenyloxy)ethylvinyl ether (X-2a), 2-(2-t-butyloxy carbonylphenyloxy)ethylvinyl ether (X-3a) and 2-(2-t-butyloxy carbonylphenylthio)ethylvinyl ether (X-4a) were synthesized.

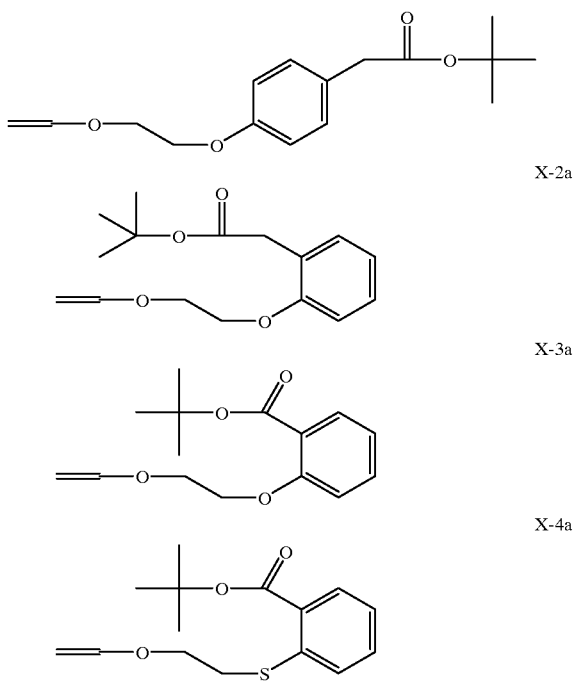

SYNTHESIS EXAMPLE II-1a 32.4 g (0.2 mols) of p-acetoxystyrene was dissolved in 120 ml of butyl acetate. To the solution was then added 0.033 g of azobisisobutylonitrile (AIBN) with stirring in a stream of nitrogen at a temperature of 80° C. every 2.5 hours three times in all. Finally, the mixture was stirred for 5 hours to undergo polymerization reaction. The reaction solution was then poured into 1,200 ml of hexane to cause the precipitation of a white resin. The resin thus obtained was dried, and then dissolved in 150 ml of methanol. To the solution was then added a solution of 7.7 g (0.19 mols) of sodium hydroxide in 50 ml of water. The reaction solution was then heated under reflux for 3 hours to undergo hydrolysis. Thereafter, the reaction solution was diluted with 200 ml of water, and then neutralized with hydrochloric acid to cause the precipitation of a white resin. The resin thus obtained was collected by filtration, washed with water, and then dried. The resin thus obtained was dissolved in 200 ml of tetrahydrofuran, and then added dropwise to 5 l of ultrapure water with vigorous stirring to cause reprecipitation. This reprecipitation procedure was then repeated three times. The resin thus obtained was then dried at a temperature of 120° C. in a vacuum drier for 12 hours to obtain a poly(p-hydroxystyrene) type alkali-soluble resin R-1.

The resin thus obtained had a weight-average molecular weight of 15,000.

SYNTHESIS EXAMPLE II-2a 35.25 g (0.2 mols) of a p-tert-butoxystyrene monomer which had been subjected to dehydration and purification by distillation in an ordinary manner and 5.21 g (0.05 mols) were dissolved in 100 ml of tetrahydrofuran. To the solution was then added 0.033 g of azobisisobutylonitrile (AIBN) with stirring in a stream of nitrogen at a temperature of 80° C. every 2.5 hours three times in all. Finally, the mixture was stirred for 5 hours to undergo polymerization reaction. The reaction solution was then poured into 1,200 ml of hexane to cause the precipitation of a white resin. The resin thus obtained was dried, and then dissolved in 150 ml of methanol.

To the solution was then added a 4 N hydrochloric acid. The reaction solution was then heated under reflux for 6 hours to undergo hydrolysis. Thereafter, the reaction solution was then reprecipitated in 5 l of ultrapure water. The resin thus obtained was collected by filtration, washed with water, and then dried. The resin thus obtained was dissolved in 200 ml of tetrahydrofuran, and then added dropwise to 5 l of ultrapure water with vigorous stirring to cause reprecipitation. This reprecipitation procedure was then repeated three times. The resin thus obtained was then dried at a temperature of 120° C. in a vacuum drier for 12 hours to obtain a poly(p-hydroxystyrene/styrene) type alkali-soluble resin R-2.

The resin thus obtained had a weight-average molecular weight of 12,000.

SYNTHESIS EXAMPLE II-3a 32.4 g (0.2 mols) of p-acetoxystyrene and 7.01 g (0.07 mols) of methyl methacrylate were dissolved in 120 ml of butyl acetate. To the solution was then added 0.033 g of azobisisobutylonitrile (AIBN) with stirring in a stream of nitrogen at a temperature of 80° C. every 2.5 hours three times in all. Finally, the mixture was stirred for 5 hours to undergo polymerization reaction. The reaction solution was then poured into 1,200 ml of hexane to cause the precipitation of a white resin. The resin thus obtained was dried, and then dissolved in 200 ml of methanol.

To the solution was then added a solution of 7.7 g (0.19 mols) of sodium hydroxide in 50 ml of water. The reaction solution was then heated under reflux for 1 hour to undergo hydrolysis. Thereafter, the reaction solution was diluted with 200 ml of water, and then neutralized with hydrochloric acid to cause the precipitation of a white resin. The resin thus obtained was collected by filtration, washed with water, and then dried. The resin thus obtained was dissolved in 200 ml of tetrahydrofuran, and then added dropwise to 5 l of ultrapure water with vigorous stirring to cause reprecipitation. This reprecipitation procedure was then repeated three times. The resin thus obtained was then dried at a temperature of 120° C. in a vacuum drier for 12 hours to obtain a poly(p-hydroxystyrene/methyl methacrylate) copolymer type alkali-soluble resin R-3. The resin thus obtained had a weight-average molecular weight of 10,000.

SYNTHESIS EXAMPLE II-4a

A Type VP8000 poly(p-hydroxystyrene) produced by Nippon Soda Co., Ltd. was used as an alkali-soluble resin R-4. The alkali-soluble resin R-4 had a weight-average molecular weight of 9,800.

50 g of the alkali-soluble resin R-4 was then dissolved in 200 ml of tetrahydrofuran. To the solution was then added 3.27 g (0.042 mols) of acetyl chloride. The mixture was then stirred. To the reaction solution was then added dropwise 4.21 g (0.042 mols) of triethylamine. Thereafter, the reaction solution was added dropwise to 5 of ultrapure water with vigorous stirring to cause reprecipitation. This reprecipitation procedure was then repeated three times. The resin thus obtained was dried at a temperature of 120° C. in a vacuum drier for 12 hours to obtain a poly(p-hydroxystyrene/p-acetoxystyrene)copolymer type alkali-soluble resin R-5. The resin thus obtained had a weight-average molecular weight of 10,000.

SYNTHESIS EXAMPLE III-1a 20 g of the alkali-soluble resin R-4 used in Synthesis Example II-4a, 80 ml of tetrahydrofuran and 6.50 g of the vinyl ether X-1a obtained in Synthesis Example I-1a were mixed in a flask. To the mixture was then added 10 mg of p-toluenesulfonic acid.

The mixture was then stirred at room temperature for 18 hours.

The reaction solution was then added dropwise to 5 l of ultrapure water with vigorous stirring to cause reprecipitation.

The resin thus obtained was then dried at a temperature of 70° C. in a vacuum drier for 12 hours to obtain an alkali-soluble resin A-1a having substituents according to the present invention.

SYNTHESIS EXAMPLES III-2a TO III-10a

The procedure of Synthesis Example III-1a was followed except that the alkali-soluble resins and vinyl ethers set forth in Table 1 below were used. As a result, alkali-soluble resins A-2a to A-10a having substituents according to the present invention were obtained.

TABLE 1

| Synthesis Example No. | Resin No. | Alkali-soluble resin/content | | Vinyl ether/content (g) | | Molecular weight | Molecular weight distribution |
|---|---|---|---|---|---|---|---|
| III-1a | A-1a | R-4 | 20 g | X-1a | 6.50 | 10,100 | 1.07 |
| III-2a | A-2a | R-4 | 20 g | X-2a | 11.50 | 10,000 | 1.07 |
| III-3a | A-3c | R-4 | 20 g | X-3a | 10.85 | 10,300 | 1.07 |
| III-4a | A-4a | R-4 | 20 g | X-4a | 9.60 | 10,200 | 1.08 |
| III-5a | A-5a | R-1 | 20 g | X-1a | 5.20 | 15,000 | 2.97 |
| III-6a | A-6a | R-2 | 20 g | X-1a | 4.16 | 12,500 | 2.48 |
| III-7a | A-7a | R-3 | 20 g | X-1a | 3.64 | 10,100 | 2.01 |
| III-8a | A-8a | R-5 | 20 g | X-1a | 4.68 | 11,000 | 1.08 |
| III-9a | A-9a | R-2 | 20 g | X-2a | 7.36 | 12,600 | 2.58 |
| III-10a | A-10a | R-5 | 20 g | X-4a | 9.22 | 10,400 | 1.07 |

SYNTHESIS EXAMPLE V-1

The alkali-soluble resin R-4 and Y-0 described later were used to prepare an acetal. Into the acetal was then introduced t-butyl bromoacetate to obtain a resin B-1 (weight-average molecular weight: 12,000; molecular weight distribution: 1.08).

SYNTHESIS EXAMPLE V-2

The alkali-soluble resin R-4 and Y-0 described later were used to prepare an acetal. Into the acetal was then introduced anhydrous t-butoxycarbonyl to obtain a resin B-2 (weight-average molecular weight: 12,000; molecular weight distribution: 1.08).

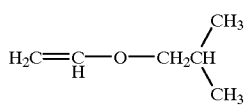
(Y-0)

EXAMPLES 1a TO 11a AND COMPARATIVE EXAMPLES 1a TO 2a

Preparation and Evaluation of Photosensitive Compositions

Materials set forth in Table 2 below were each dissolved in 8 g of PGMEA (propylene glycol monoethyl ether acetate), and then filtered through a filter having a pore diameter of 0.2 μm to prepare a resist solution. The resist solution thus prepared was applied to a silicon wafer by means of a spin coater, and then dried at a temperature of 130° C. over a vacuum suction type hot plate for 60 seconds to obtain a resist layer having a thickness of 0.8 μm.

TABLE 2

Examples and Comparative Examples

| Example No. | Resin | | Photo-acid generator | Organic base compound |
|---|---|---|---|---|
| Example 1a | A-1a | (1.60 g) | D-1 (0.80 g) | E-3 (0.005 g) |
| Example 2a | A-2a | (1.60 g) | D-1 (0.80 g) | E-3 (0.004 g) |
| Example 3a | A-3a | (1.60 g) | D-1 (0.80 g) | E-3 (0.004 g) |
| Example 4a | A-4a | (1.60 g) | D-1 (0.80 g) | E-3 (0.004 g) |
| Example 5a | A-5a | (1.60 g) | D-1 (0.80 g) | E-2 (0.004 g) |
| Example 6a | A-6a | (1.60 g) | D-2 (0.80 g) | E-1 (0.004 g) |
| Example 7a | A-7a | (1.60 g) | D-2 (0.80 g) | E-2 (0.004 g) |
| Example 8a | A-8a | (1.60 g) | D-3 (0.80 g) | E-3 (0.004 g) |
| Example 9a | A-9a | (1.60 g) | D-3 (0.80 g) | E-1 (0.003 g) |
| Example 10a | A-10a | (1.60 g) | D-2 (0.80 g) | E-1 (0.004 g) |
| Example 11a | A-11a | (1.60 g) | D-1 (0.80 g) | E-2 (0.005 g) |
| Comparative Example 1a | B-1 | (1.60 g) | D-1 (0.80 g) | E-3 (0.005 g) |
| Comparative Example 2a | B-2 | (1.60 g) | D-2 (0.80 g) | E-3 (0.005 g) |

The various photo-acid generators and organic base compounds used in the foregoing examples will be shown below.

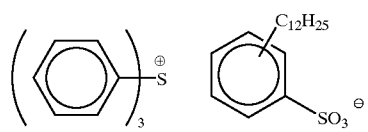
(D-1)

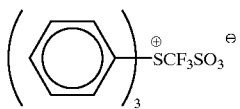
(D-2)

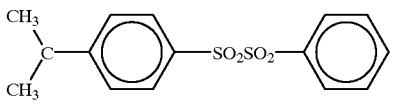
(D-3)

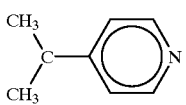
(E-1)

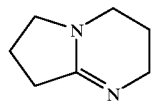
(E-2)

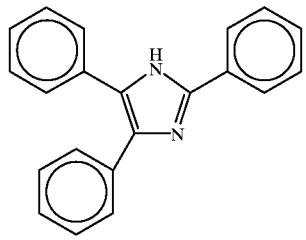
(E-3)

The resist layer thus prepared was then exposed to light from a 248 nm KrF exima laser stepper (NA=0.45). The resist layer thus exposed was heated over a 100° C. hot plate for 60 seconds, immediately dipped in a 0.26 N aqueous solution of tetramethylammonium hydroxide (TMAH) for 60 seconds, rinsed with water for 30 seconds, and then dried. The pattern formed on the silicon wafer thus obtained was then observed by a scanning type electron microscope to evaluate the properties of the resist. The results are set forth in Table 3 below.

The resolution set forth in Table 3 represents the threshold resolution at the exposure at which a mask pattern composed of lines and spaces each having a width of 0.40 μm is reproduced.

For the evaluation of lone pattern, the reproducibility at the foregoing exposure was judged in accordance with the following three step criterion. When the line width of the lone pattern thus obtained is from 90% to 100% of the desired value (0.30 μm), the reproducibility is judged as "A". When the line width of the lone pattern thus obtained is from 50% to 90% of the desired value, the reproducibility is judged as "B". When the line width of the lone pattern thus obtained is not more than 50% of the desired value or the lone pattern disappears, the reproducibility is judged as "C".

For the evaluation of top profile, the resist pattern thus obtained was observed by a scanning type electron microscope to evaluate the shape of the top of the pattern. When the shape of the top of the pattern is rectangular, it is judged as good.

TABLE 3

Threshold Resolution

| Example No. | Threshold resolution | Lone pattern reproducibility | Top profile |
| --- | --- | --- | --- |
| Example 1a | 0.25 | A | Good |
| Example 2a | 0.26 | A | Good |
| Example 3a | 0.25 | A | Good |
| Example 4a | 0.25 | A | Good |
| Example 5a | 0.26 | A | Good |
| Example 6a | 0.25 | A | Good |
| Example 7a | 0.26 | A | Good |
| Example 8a | 0.26 | A | Good |
| Example 9a | 0.25 | A | Good |
| Example 10a | 0.25 | A | Good |
| Example 11a | 0.25 | A | Good |
| Comparative Example 1a | 0.26 | B | Round |
| Comparative Example 2a | 0.26 | C | Reduced thickness |

As can be seen in Table 3, the positive photosensitive compositions of the various examples according to the present invention gave satisfactory results. On the contrary, the photosensitive compositions of the various comparative examples leave something to be desired particularly in the dimensional reproducibility of lone pattern and the shape of top profile.

[Synthesis Example I-1b: Synthesis of vinyl ether]

83.1 g (0.5 mols) of p-cyclohexylphenol was dissolved in 300 ml of toluene. To the solution was then added 150 g of 2-chloroethylvinylether. To the solution were then added 25 g of sodium hydroxide, 5 g of tetrabutylammonium bromide and 60 g of triethylamine. The mixture was then heated to a temperature of 120° C. with stirring for 5 hours.

The reaction solution was washed with water, and then distilled under reduced pressure to remove excess chloroethyl vinyl ether and toluene therefrom. The resulting oil content was then distilled under reduced pressure to obtain a desired p-cyclohexylphenoxy ethyl vinyl ether (X-1b).

[Synthisis Examples I-2b, I-3b, I-4b, I-4b, I-5b, I-6b, I-7b, I-8b, I-9b]

The following vinyl ethers Xb-2, Xb-3, Xb-4, Xb-5, Xb-6, Xb-7, Xb-8 and Xb-9 were obtained in the same manner as in Synthesis Example I-1b.

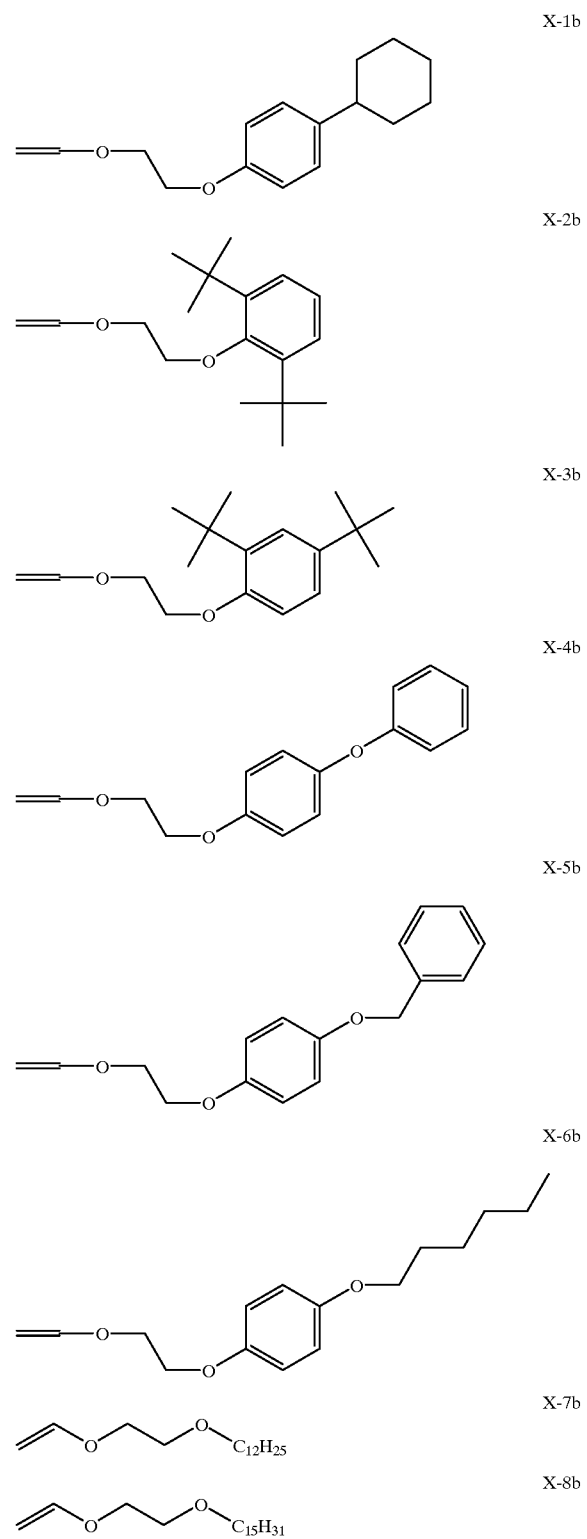

X-9b

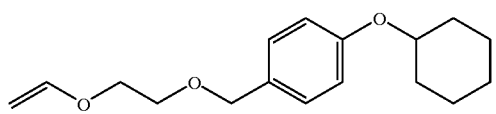

EXAMPLE III-1b 20 g of the alkali-soluble resin R-4 used in Synthesis Example II-4a, 80 ml of tetrahydrofuran and 6.50 g of the vinyl ether X-1b obtained in Synthesis Example I-1b were mixed in a flask. To the mixture was then added 10 mg of p-toluenesulfonic acid. The mixture was then stirred at room temperature for 18 hours.

The reaction solution was then added dropwise to 5 l of ultrapure water with vigorous stirring to cause reprecipitation.

The resin thus obtained was then dried at a temperature of 70° C. in a vacuum drier for 12 hours to obtain an alkali-soluble resin B-1b having substituents according to the present invention.

SYNTHESIS EXAMPLES III-2b TO III-10b

The procedure of Synthesis Example III-1b was followed except that the alkali-soluble resins and vinyl ethers set forth in Table 4 below were used. As a result, alkali-soluble resins B-2b to B-15b having substituents according to the present invention were obtained.

TABLE 4

| Resin | Vinyl ether used | Backbone polymer |
|---|---|---|
| B-1b | X-1b | R-4 |
| B-2b | X-2b | R-4 |
| B-3b | X-3b | R-4 |
| B-4b | X-4b | R-4 |
| B-5b | X-5b | R-4 |
| B-6b | X-6b | R-4 |
| B-7b | X-1b | R-1 |
| B-8b | X-2b | R-1 |
| B-9b | X-3b | R-1 |
| B-10b | X-4b | R-1 |
| B-11b | X-5b | R-1 |
| B-12b | X-6b | R-1 |
| B-13b | X-7b | R-4 |
| B-14b | X-8b | R-4 |
| B-15b | X-9b | R-4 |

SYNTHESIS EXAMPLES IV-1 TO IV-4

The alkali-soluble resins set forth in Table 5 below and ethyl vinyl ether (Y-1), naphthyloxy ethyl vinyl ether (Y-2) and (benzyloxyethoxy)ethyl vinyl ether (Y-3) shown below were used to obtain resins C-1 to C-3.

TABLE 5

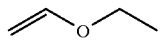
Y-1

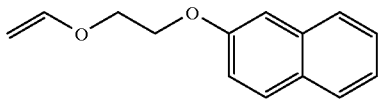
Y-2

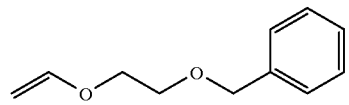
Y-3

| Resin | Vinyl ether used | Backbone polymer |
|---|---|---|
| C-1 | Y-1 | R-4 |
| C-2 | Y-2 | R-4 |
| C-3 | Y-3 | R-4 |
| C-4 | Y-2 | R-1 |

EXAMPLES 1b TO 15b AND COMPARATIVE EXAMPLES 1b TO 4b

Preparation and Evaluation of Photosensitive Composition

Materials set forth in Table 6 below were each dissolved in 8 g of PGMEA (propylene glycol monoethyl ether), and then filtered through a filter having a pore diameter of 0.2 μm to prepare a resist solution. The resist solution thus prepared was applied to a silicon wafer by means of a spin coater, and then dried at a temperature of 130° C. over a vacuum suction type hot plate for 60 seconds to obtain a resist layer having a thickness of 0.8 μm.

TABLE 6

| Example No. | Resin | Amount of resin (g) | Photo-acid generator | Amount of photo-acid generator (g) | Organic base | Amount of organic base (g) |
|---|---|---|---|---|---|---|
| Example 1b | B-1b | 2.0 | D-1 | 0.05 | E-2 | 0.001 |
| Example 2b | B-2b | 2.0 | D-1 | 0.05 | E-2 | 0.001 |
| Example 3b | B-3b | 2.0 | D-1 | 0.05 | E-2 | 0.001 |
| Example 4b | B-4b | 2.0 | D-1 | 0.05 | E-2 | 0.001 |
| Example 5b | B-5b | 2.0 | D-1 | 0.05 | E-3 | 0.001 |
| Example 6b | B-6b | 2.0 | D-1 | 0.05 | E-2 | 0.001 |
| Example 7b | B-7b | 2.0 | D-1 | 0.05 | E-2 | 0.001 |
| Example 8b | B-8b | 2.0 | D-1 | 0.05 | E-2 | 0.001 |
| Example 9b | B-9b | 2.0 | D-1 | 0.05 | E-3 | 0.001 |
| Example 10b | B-10b | 2.0 | D-1 | 0.05 | E-2 | 0.001 |

TABLE 6-continued

| Example No. | Resin | Amount of resin (g) | Photo-acid generator | Amount of photo-acid generator (g) | Organic base | Amount of organic base (g) |
|---|---|---|---|---|---|---|
| Example 11b | B-11b | 2.0 | D-2 | 0.05 | E-1 | 0.001 |
| Example 12b | B-12b | 2.0 | D-3 | 0.05 | E-2 | 0.001 |
| Example 13b | B-13b | 2.0 | D-1 | 0.05 | E-2 | 0.001 |
| Example 14b | B-14b | 2.0 | D-1 | 0.05 | E-3 | 0.001 |
| Example 15b | B-15b | 2.0 | D-2 | 0.05 | E-2 | 0.001 |
| Comparative Example 1b | C-1 | 2.0 | D-1 | 0.05 | E-2 | 0.001 |
| Comparative Example 2b | C-2 | 2.0 | D-2 | 0.05 | E-1 | 0.001 |
| Comparative Example 3b | C-3 | 2.0 | D-2 | 0.05 | E-2 | 0.001 |
| Comparative Example 4b | C-4 | 2.0 | D-2 | 0.05 | E-3 | 0.001 |

The photo-acid generators (D-1) to (D-3) and organic base compounds (E-1) to (E-3) are the same as used in Examples 1a to 11a and Comparative Examples 1 and 2.

The resist layer thus prepared was then exposed to light from a 248 nm KrF exima laser stepper (NA=0.45). The resist layer thus exposed was heated over a 100° C. hot plate for 60 seconds, immediately dipped in a 0.26 N aqueous solution of tetramethylammonium hydroxide (TMAH) for 60 seconds, rinsed with water for 30 seconds, and then dried. The pattern formed on the silicon wafer thus obtained was then observed by a scanning type electron microscope to evaluate the properties of the resist. The results are set forth in Table 7 below.

The resolution set forth in Table 7 represents the threshold resolution at the exposure at which a mask pattern composed of lines and spaces each having a width of 0.30 µm is reproduced.

The resist pattern thus obtained was then observed under an optical microscope or SEM to evaluate the surface roughness thereof. When the surface is smooth, it is judged as "A". When the surface is found slightly rough, it is judged as "B". When the surface is found remarkably rough, it is judged as "C".

For the evaluation of dry etching resistance, the resist was dry-etched in an ordinary manner. The dry etching resistance of the resist was then evaluated relative to that of novolak resin as 1.0. The closer the value is, the better is the dry etching resistance.

TABLE 7

| Example No. | Sensitivity (mj/cm$^2$) | Resolution (µm) | Surface roughness | Dry etching resistance |
|---|---|---|---|---|
| Example 1b | 22 | 0.24 | A | 1.05 |
| Example 2b | 23 | 0.25 | A | 1.10 |
| Example 3b | 21 | 0.26 | A | 1.10 |
| Example 4b | 22 | 0.25 | A | 1.03 |
| Example 5b | 23 | 0.25 | A | 1.02 |
| Example 6b | 20 | 0.26 | A | 1.03 |
| Example 7b | 19 | 0.24 | A | 1.05 |
| Example 8b | 21 | 0.25 | A | 1.10 |
| Example 9b | 22 | 0.25 | A | 1.10 |
| Example 10b | 20 | 0.25 | A | 1.03 |
| Example 11b | 20 | 0.26 | A | 1.02 |
| Example 12b | 22 | 0.25 | A | 1.03 |
| Example 13b | 24 | 0.27 | A | 1.13 |
| Example 14b | 25 | 0.27 | A | 1.12 |
| Example 15b | 24 | 0.26 | A | 1.05 |
| Comparative Example 1b | 28 | 0.28 | C | 1.30 |
| Comparative Example 2b | 30 | 0.29 | B | 1.30 |
| Comparative Example 3b | 29 | 0.30 | C | 1.25 |
| Comparative Example 4b | 32 | 0.29 | C | 1.30 |

As can be seen in Table 7, the positive photosensitive compositions of the various examples according to the present invention gave satisfactory results. On the contrary, the photosensitive compositions of the various comparative examples leave something to be desired particularly in the smoothness of the surface of resist and the dry etching resistance of resist.

As mentioned above, the present invention provides an excellent chemically-sensitized positive photosensitive composition which gives an excellent shape of pattern profile, particularly excellent smoothness of side wall of pattern, exhibits a high dry etching resistance, a high sensitivity and a high resolution and generates no standing wave.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition, comprising:
   (a) a compound having a group represented by the following general formula (Ia) which decomposes by the action of an acid to enhance its solubility in an alkaline developing solution; and
   (b) a compound which generates an acid upon irradiation with actinic rays or radiation:

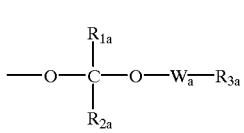

(Ia)

wherein $R_{1a}$ and $R_{2a}$ may be the same or different and each represent a hydrogen atom or $C_{1-4}$ alkyl group; $W_a$ represents a single bond or divalent organic group; and $R_{3a}$ represents a group which decomposes by the action of an acid and is selected from the group consisting of —COOA$^0$, —O—A$^0$ and —O—C(=O)—O—A$^0$, wherein A$^0$ represents —C($R^{01}$)($R^{02}$)($R^{03}$), —Si($R^{01}$)($R^{02}$)($R^{03}$) or —C($R^{04}$)($R^{05}$)—O—$R^{06}$, where $R^{01}$, $R^{02}$, $R^{03}$, $R^{04}$ and $R^{05}$ may be the same or different and each represents a hydrogen atom, an alkyl group, a cycloalkyl group, an alkenyl group or an aryl group, $R^{06}$ represents an alkyl group or an aryl group, two of $R^{01}$ to $R^{03}$ may be connected to each other to form a ring or two of $R^{04}$ to $R^{06}$ may be connected to each other to form a ring, with the proviso that at least two of $R^{01}$ to $R^{03}$ are groups other than a hydrogen atom.

2. The positive photosensitive composition according to claim 1, wherein said component (a) is a resin having a group represented by the general formula (Ia) which decomposes by the action of an acid to enhance its solubility in an alkaline developing solution.

3. The positive photosensitive composition according to claim 1, further comprising a resin which is insoluble in water but soluble in an alkaline aqueous solution.

4. A positive photosensitive composition, comprising:

(a) a resin having a group represented by the following general formula (Ib) which decomposes by the action of an acid to enhance its solubility in an alkaline developing solution; and (b) a compound which generates an acid upon irradiation with actinic rays or radiation:

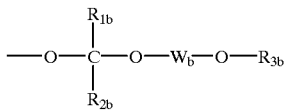

(Ib)

wherein $R_{1b}$ and $R_{2b}$ may be the same or different and each represent a hydrogen atom or a $C_{1-4}$ alkyl group; $W_b$ represents a divalent organic group; and $R_{3b}$ represents a $C_{11-20}$ chain alkyl group which may have substituents, a $C_{11-20}$ cyclic alkyl group which may have substituents, a $C_{11-30}$ aryl group which may have substituents or a $C_{12-30}$ aralkyl group which may have substituents.

5. The positive photosensitive composition according to claim 4, wherein $R_{1b}$ and $R_{2b}$ may be the same or different and each represent a hydrogen atom or a $C_{1-4}$ alkyl group; $W_b$ represents a divalent organic group; and $R_{3b}$ represents a $C_{11-30}$ aryl group which may have substituents or a $C_{12-30}$ aralkyl group which may have substituents.

6. The positive photosensitive composition according to claim 4, further comprising a compound which decomposes by the action of an acid to enhance its solubility in an alkaline developing solution.

7. The positive photosensitive composition according to claim 1, wherein $R_{3a}$ is a substituent selected from the group consisting of a tertiary alkylester group, a tertiary alkylcarbonate group and —C(=O)—O—C($R_{10a}$)($R_{11a}$)O$R_{12a}$, wherein $R_{10a}$ and $R_{11a}$ each represents a hydrogen atom or a $C_{1-4}$ alkyl group and $R_{12a}$ represents a $C_{1-4}$ alkyl group.

* * * * *